United States Patent
Yamamoto

(10) Patent No.: US 6,697,289 B1
(45) Date of Patent: Feb. 24, 2004

(54) REDUNDANT ADDRESS SETTING CIRCUIT AND SEMICONDUCTOR MEMORY DEVICE INCLUDING THE SAME

(75) Inventor: Kouki Yamamoto, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/561,439

(22) Filed: Apr. 28, 2000

(30) Foreign Application Priority Data

Apr. 28, 1999 (JP) .......................... 11-122015

(51) Int. Cl.$^7$ ............................ G11C 7/00; G11C 29/00
(52) U.S. Cl. ..................... 365/200; 365/225.7; 365/194
(58) Field of Search .............. 365/200, 275.7, 365/185.08, 194

(56) References Cited

U.S. PATENT DOCUMENTS

| 5,276,649 A | * | 1/1994 | Hoshita et al. | ............. | 365/206 |
| 5,677,917 A | * | 10/1997 | Wheelus et al. | ............. | 714/726 |

FOREIGN PATENT DOCUMENTS

| JP | 04-274096 | 9/1992 |
| JP | 06-290588 | 10/1994 |
| JP | 08-321197 | 3/1996 |
| JP | 8-96594 | 4/1996 |
| JP | 09-069292 | 3/1997 |
| JP | 09-171698 | 6/1997 |
| JP | 10-334963 | * 12/1998 |

OTHER PUBLICATIONS

English Abstracts of JP 04–274096, JP 09–1711698, JP 08–321197, JP 09–069292, and 06–290588 noted above.
Copy of Japanese Patent Office Action dated Jan. 29, 2002 regarding corresponding foreign application.
English translation of indicated portions of above Japanese Patent Office Action.

* cited by examiner

*Primary Examiner*—VanThu Nguyen
(74) *Attorney, Agent, or Firm*—Darryl G. Walker; Bradley T. Sako

(57) ABSTRACT

According to one embodiment, a redundant address setting circuit can generate a lower peak transient current value during an initial setting operation when defective address information is generated from fuse values. Programming circuits (40-0 to 40-2n) can each include fuses for storing a defective address. The programming circuits are arranged into a first group (40-0 to 40-n) that can be activated in response to a fuse reset signal FRST, and a second group (40-n+1 to 40-2n) that can be activated in response to a delayed fuse reset signal FRST1. The fuse reset signals FRST and FRST1 are activated at different times, distributing transient current generated by the programming circuits (40-0 to 40-2n) over two or more time periods, thereby reducing peak transient current during an initial setting operation.

20 Claims, 16 Drawing Sheets

REDUNDANT ADDRESS SETTING CIRCUIT AND SEMICONDUCTOR MEMORY DEVICE INCLUDING THE SAME

TECHNICAL FIELD

The present invention relates generally to redundancy circuits for semiconductor memory devices, and more particularly to redundancy address setting circuits for semiconductor memories.

BACKGROUND OF THE INVENTION

The storage capacity of semiconductor memory devices has continued to increase at a remarkable rate. This is particularly true for high-density memory devices such as dynamic random access memories (DRAMs). The increase in storage capacity is due to a number of factors, including advancements in processing technology and/or reductions in the size of various features within a DRAM. Reduced features include smaller spacings between repeated structures (smaller "pitch"), as well as reductions in the size of particular components, such as conductive line widths, transistors, capacitors, and the like.

Due to the great number of memory cells and high complexity of most semiconductor memory devices, it can be very difficult to consistently manufacture devices that are completely free of defects. If all semiconductor devices having defects were completely discarded, the manufacturing yield of such devices would be significantly lowered. In order to increase fabrication yield, most semiconductor devices include some sort of redundancy scheme.

A redundancy circuit typically replaces one circuit element (such as a defective memory cell) with another (such as a redundant memory cell). In operation, when an address is applied to a memory device that corresponds to a defective memory cell, a redundancy circuit can detect such an address and prevent the defective memory cell from being accessed. Instead, the redundancy circuit can provide access to a redundant memory cell. An access to a redundant memory cell can be indistinguishable from an access to a "normal" memory cell.

In this way, even if a semiconductor memory device includes defective memory cells (due to uncontrollable process variation, for example), it can still be fully functional through the use of redundancy circuits. This can allow semiconductor devices with defective memory cells to be packaged and provided as working devices. Consequently, the overall fabrication yield can be increased.

As noted above, a redundancy circuit can continuously monitor externally applied address values. Such external address values can be compared with known defective addresses (addresses corresponding to defective memory cells) to determine when an access should be switched to a redundant memory cell. Information for identifying defective addresses is typically stored in a programming circuit. Many programming circuits include fusible links (fuses) for storing defective address information.

An example of a programming circuit is set forth in Japanese Laid Open Patent Application No. 8-96594. In the programming circuit of Japanese Laid Open Patent Application No. 8-96594, two fuse elements are allocated for each bit of an applied external address. According to the defective address bit value, one of the two fuses is opened. Thus, for each bit of a defective address, one of two fuses will be opened to thereby "store" the defective address for the redundancy circuit.

A drawback to the approach set forth in Japanese Laid Open Patent Application No. 8-56594 is that two fuses are required for each address bit. For example, if a semiconductor memory device received a 10-bit address, 20 fuses would be required to program one defective address. Consequently, in a semiconductor device that is capable of replacing 1,024 defective addresses, as many as 2,048 fuses would be required. Fuses are typically devices of relatively large width. Thus, a large number of fuses can increase the overall area of a memory device. Such increases in area can translate into higher manufacturing costs.

One way to overcome the above drawbacks is to provide one bit for programming each defective address bit. In such an approach, the values of defective addresses are first determined. A circuit for each bit is then provided that includes a fuse and a volatile hold circuit, such as a flip-flop, or the like. Upon power-up (when power is initially applied to the semiconductor memory device) the volatile hold circuit will store a "0" or a "1" according to whether the corresponding fuse is opened or not. In this way, only one fuse can be required for each bit of a defective address. Thus, the number fuses can be reduced by half, saving considerable area.

The above-described method, that utilizes one fuse per address bit, differs from the approach shown in Japanese Laid Open Patent Application No. 8-56594 in that the application of power is required to set the defective address values. The application of power in such an "initial setting" operation results in the formation of current paths through the fuse/hold circuit combinations. More particularly, current can flow through a current path and volatile circuit according to whether the corresponding fuse is opened or not. Consequently, a setting operation can draw a substantial amount of transient current. Still further, because the amount of current drawn is proportional to the number of fuses, the more defective addresses there are, the more transient current will be drawn in an initial setting operation.

As noted above, the number of memory cells in a semiconductor device continues to increase each year. Correspondingly, the number of defective memory cells can also increase. In order to maintain high yields, it may be necessary to construct redundancy circuits to address the increasing numbers of defective memory cells. It is thus expected that larger and larger numbers of programming circuits will be needed.

Because the number of programming circuits is expected to increase with higher density memories, the resulting transient current is also expected to increase. At the same time, the power supply requirements for semiconductor memories is not expected to increase, or is expected to increase at a slower rate. This is due to various power conservation techniques, such as dividing a memory into separately activated banks or blocks. Consequently, the power supply specifications may have limited current supplying capabilities, and transient current on power up can become a significant factor in design.

It may be that power supply requirements of a system may be sufficient to meet the transient current requirements resulting from increased numbers of programming circuits. However, such larger current requirements may still present drawbacks in other stages of manufacturing. For example, current requirements can be an important factor when a device is tested prior to being shipped. More particularly, many manufacturing operations can include an accelerated testing step that can detect devices that might fail over time.

Many accelerated testing approaches include mounting a large number of devices on a test board. Such devices can be tested at a lower speed than normal operating speeds. At lower testing speeds, semiconductor devices can draw less instantaneous and/or transient current. Consequently, test boards and corresponding equipment can have limited current supplying capabilities. However, higher density devices having larger numbers of programming circuits may require more current than a typical test board can provide. Consequently, a special, usually more costly, test board must be built to supply the higher start-up current of such devices.

It would be desirable to arrive at some way of providing a semiconductor device having programming circuits for redundancy circuits that does not have as a high a start-up transient current as conventional approaches.

SUMMARY OF THE INVENTION

According to one embodiment of the present invention, an address setting circuit may include a first fuse element group in which at least one first defective address may be stored, and a second fuse element group in which at least one second defective address may be stored. A timing circuit can enable current paths through the first and second fuse element groups at substantially different times, distributing transient current over time, and thereby reducing peak current.

According to one aspect of the embodiments, a redundant address setting circuit may include a group of fuse elements corresponding to a defective address. A timing circuit can enable current paths through one portion of the fuse elements at one time, and though another portion of the fuse elements at another time.

According to another aspect of the embodiments, a redundant address setting circuit may include a first latch circuit, a second latch circuit, and a timing signal generator circuit. The first latch circuit may include a first nonvolatile element that stores first defective address information, a first volatile storage circuit that stores the first defective address information from the first nonvolatile element, and a first setting circuit that transfers the first defective address information from the first nonvolatile element to the first volatile storage circuit in response to a first control signal. The second latch circuit may include a second nonvolatile element that stores second defective address information, a second volatile storage circuit that stores the second defective address information from the second nonvolatile element, and a second setting circuit that transfers the second defective address information from the second nonvolatile element to the second volatile storage circuit in response to a second control signal. The timing signal generating circuit can activate the second control signal after the first control signal.

According to another aspect of the embodiments, a semiconductor memory device may include a memory cell array having a number of memory cells, a redundant memory cell array having redundant memory cells, a selection circuit that selects a memory cell based on an applied address, and a redundancy decoder. In response to a defective address, the redundancy decoder can inhibit the operation of the selection circuit and select a redundant memory cell from the redundant memory cell array. The redundancy decoder may include nonvolatile memory elements, volatile memory elements, and setting circuits. The nonvolatile memory elements may store information for a number of defective addresses. The setting circuits can transfer the information stored in the nonvolatile memory elements to the volatile memory elements in response to at least two fuse reset signals. The setting circuits can transfer one portion of the information stored in the nonvolatile memory elements to volatile memory elements during a first period of time, and another portion of the information stored in the nonvolatile memory elements to volatile memory elements during a second period of time that is different than the first period of time.

DETAILED DESCRIPTION OF THE EMBODIMENTS

Various embodiments according to the present invention will now be described with reference to a number of figures.

The embodiments include a redundant address setting circuit that can draw less start-up transient current than conventional approaches, as well a semiconductor memory device that includes such a redundant address setting circuit.

Figure 1:
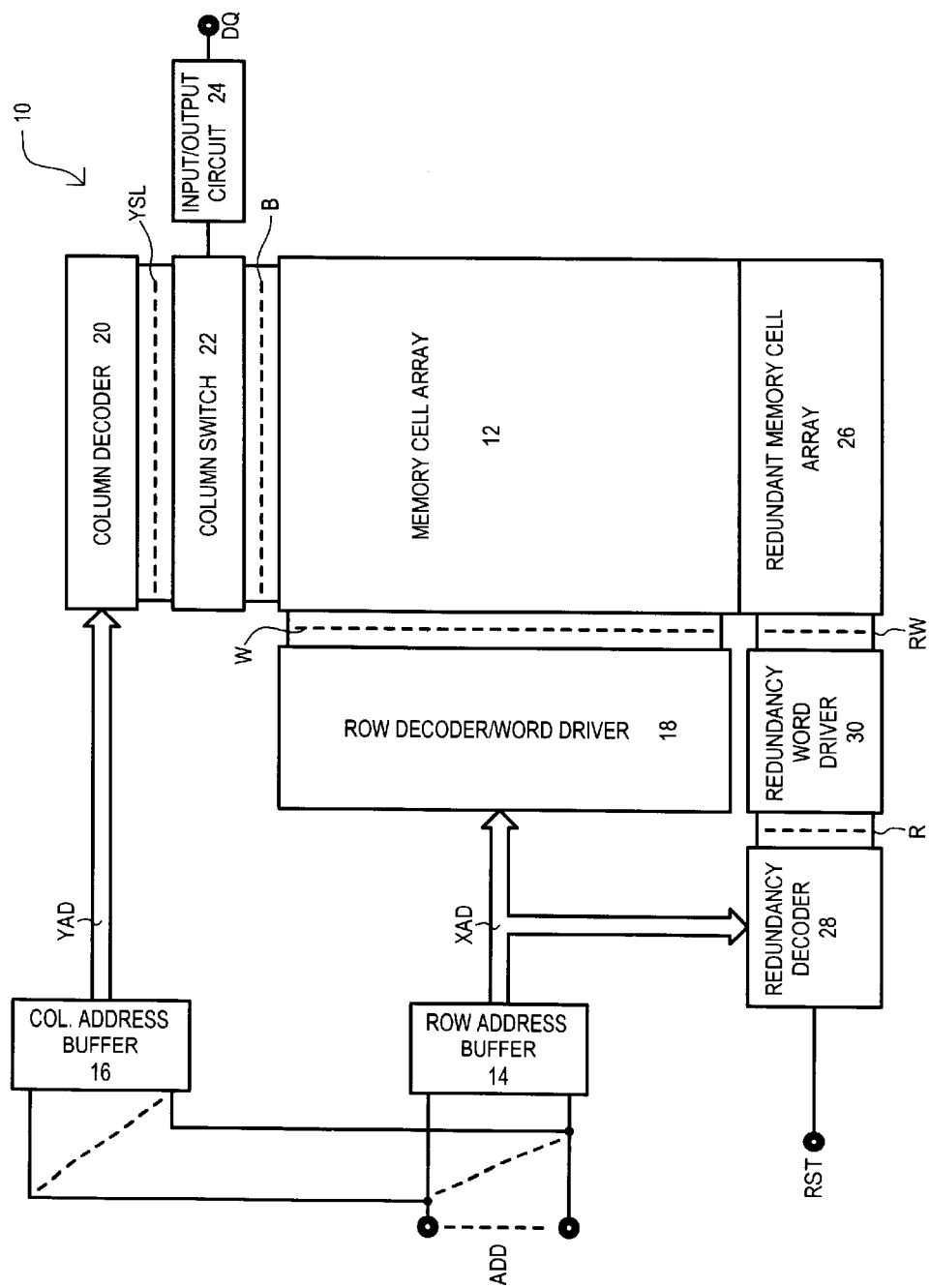
FIG. 1 is a block diagram of a semiconductor memory device having a redundancy function.

Referring now to FIG. 1, a block diagram is set forth illustrating a semiconductor memory device 10 having a redundancy function. The particular example of FIG. 1 shows row-wise redundancy. However, it is understood that the present invention could be employed for column-wise redundancy as well.

A semiconductor memory device 10 may include a memory cell array 12 and a redundant memory cell array 26. Memory cells within memory cell array 12 can be accessed by word lines W that are selected and driven by a row decoder/word driver 18. Redundant memory cells within redundant memory cell array 26 can be accessed by redundant word lines RW that are selected and driven by a redundancy decoder 28 and a redundancy word driver 30.

In operation, an external address ADD can be received by a row address buffer 14. The row address buffer 14 can generate an internal row address XAD that is supplied to both the row decoder/word driver 18 and the redundancy decoder 28. In a similar fashion, an external address ADD can be received by a column address buffer 16 that generates an internal column address YAD for a column decoder 20. A column decoder 20 can activate a column switch circuit 22, and thereby provide a conductive path between columns of the memory cell array 12 and/or the redundant memory cell array 26 to an input/output circuit 24. Input/output circuit 24 can provide conductive read and write paths to data terminals DQ.

The row decoder/word driver 18 can decode a received internal row address XAD. According to such a decoder operation a selected word line, from a number of such word lines W, can be driven.

The redundancy decoder 28 can determine if an applied internal row address XAD matches one or more programmed defective addresses. If such a match exists, a corresponding redundancy select signal R is activated.

Figure 2:
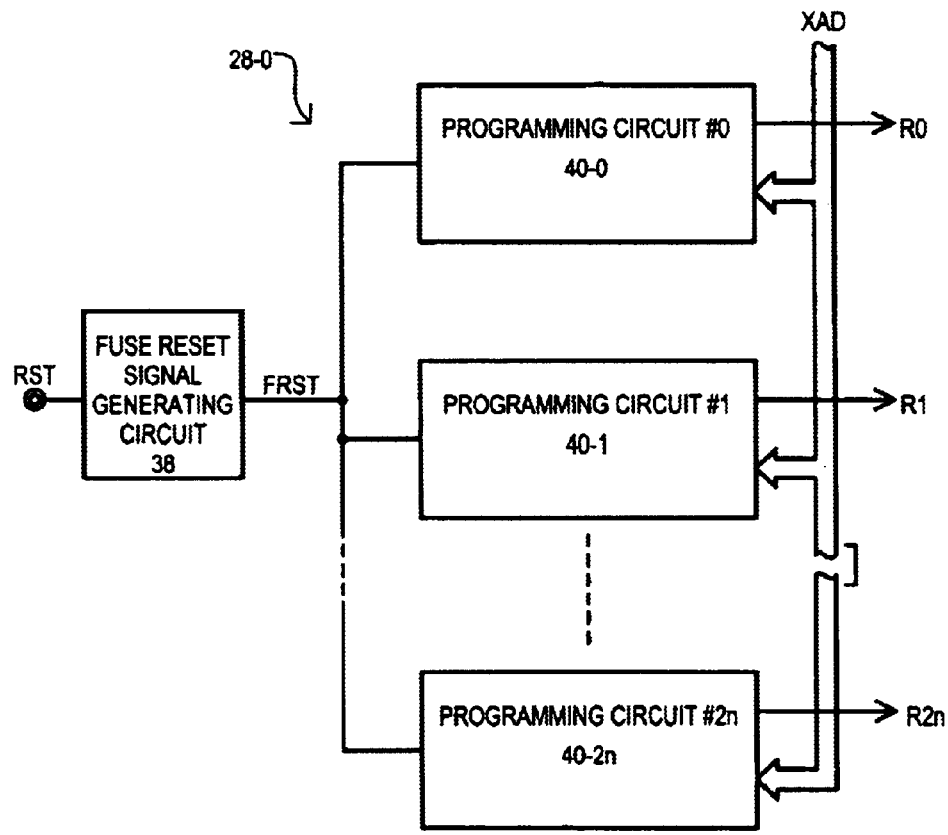
FIG. 2 is a block diagram of a conventional redundancy decoder circuit.
Figure 4:
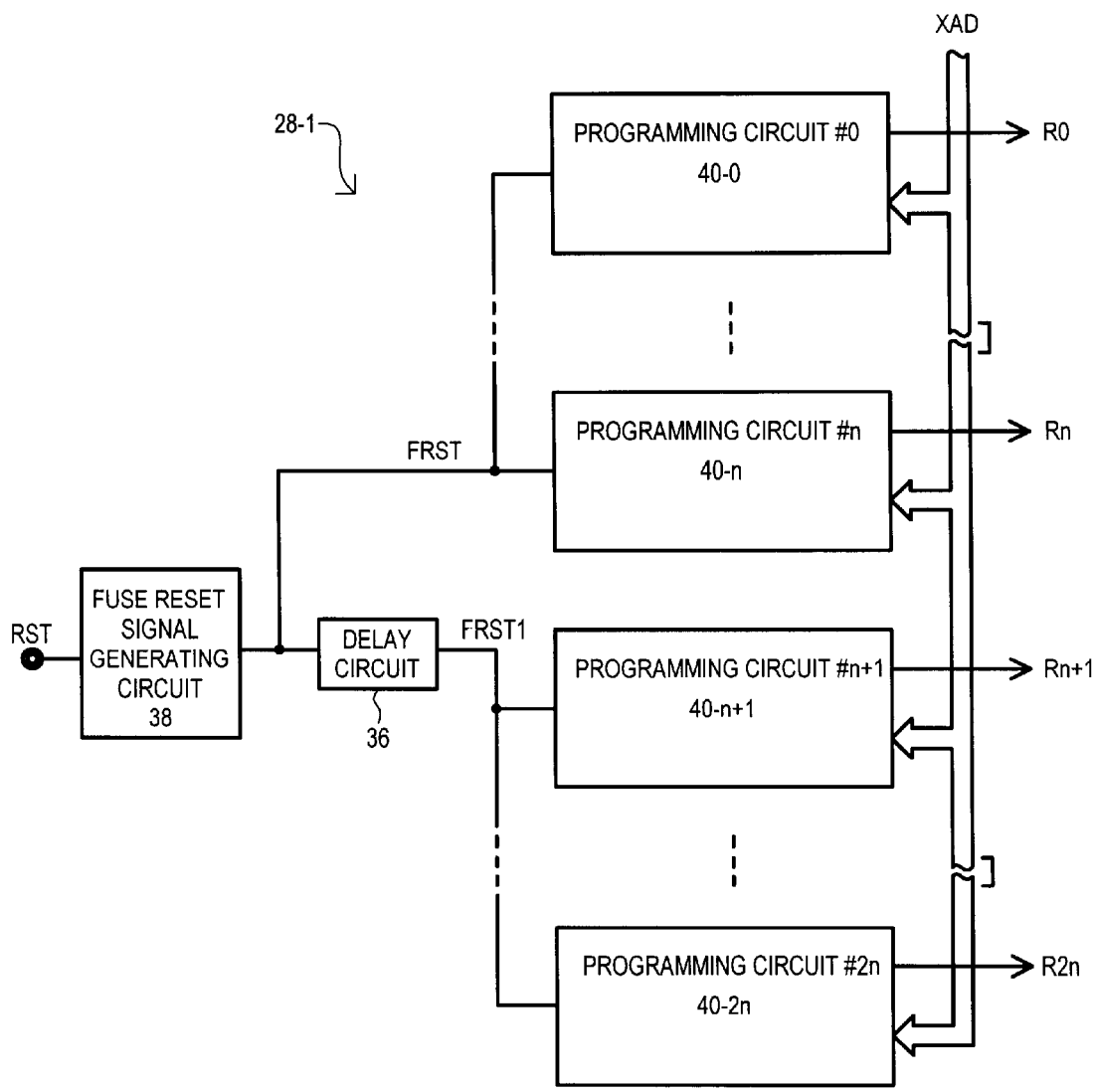
FIG. 4 is a block diagram of a redundancy decoder circuit according to a first embodiment.

One example of a redundancy decoder 28 according to the present invention is shown in FIG. 4. To contrast the present invention to conventional approaches, a conventional redundancy decoder is shown in FIG. 2.

The conventional example will first be described. Referring now to FIG. 2, a conventional redundancy decoder is designated by the general reference character 28-0, and is shown to include programming circuits 40-0 to 40-2n and a fuse reset signal generating circuit 38.

Each programming circuit (40-0 to 40-2n) can receive an internal address XAD and a fuse reset signal FRST generated by the fuse reset signal generating circuit 38. If an applied internal address XAD matches a defective address stored in a programming circuit (40-0 to 40-2n), the programming circuit can activate a corresponding redundancy detect signal R0 to R2n.

Referring now to FIG. 4, a redundancy decoder according to one embodiment is shown in a block diagram. The redundancy decoder is designated by the general reference character 28-1, and is shown to include programming circuits 40-0 to 40-n and 40-n+1 to 40-2n.

Each programming circuit (40-0 to 40-2n) can receive an internal address XAD and a fuse reset signal (FRST or FRST1) and provide a corresponding redundancy select signal R0 to R2n. More particularly, one set of programming circuits 40-0 to 40-n can receive fuse reset signal FRST, while another set of programming circuits 40-n+1 to 40-2n can receive a delayed fuse reset signal FRST1. In one particular example, the fuse reset signal FRST can be provided to one half of the programming circuits, while the delayed fuse reset signal FRST1 can be provided to the other half of the programming circuits.

In FIG. 4, the fuse reset signal generating circuit 38 can generate the fuse reset signal FRST. The fuse reset signal FRST can then be applied to a delay circuit 36 to generate the delayed fuse reset signal FRST1.

If reference is made back to FIG. 2, it is shown that the conventional case 28-0 does not include a delay circuit, but instead provides a fuse reset signal FRST to all programming circuits (40-0 to 40-2n) essentially simultaneously. This is in contrast to the arrangement of FIG. 4, which applies a fuse reset signal FRST and a delayed fuse reset signal FRST1 to different groups of programming circuits (40-0 to 40-n and 40-n+1 to 40-2n).

Figure 9:
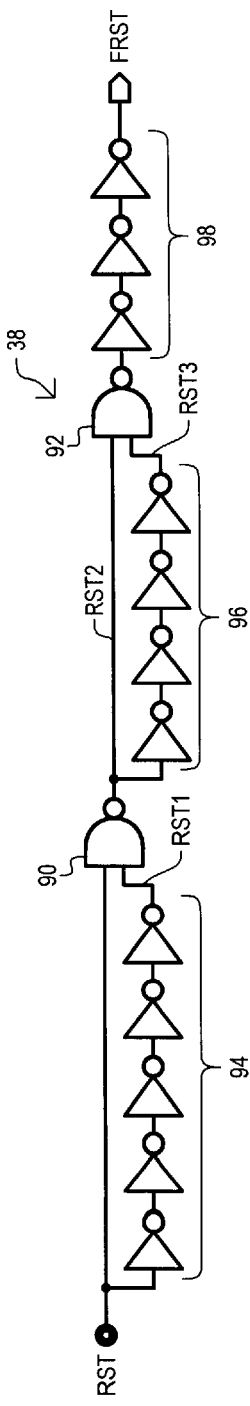
FIG. 9 is a schematic diagram of a fuse reset signal generating circuit according to one embodiment.

One example of a fuse reset signal generating circuit, such as that shown as 38 in FIG. 4, is shown in FIG. 9. The fuse reset signal generating circuit 38 can receive an externally applied reset signal RST and generate a first reset signal RST1, a second reset signal RST2, a third reset signal RST3 and a fuse reset signal FRST.

In the particular example of FIG. 9, a fuse reset signal generating circuit 38 can include a first NAND gate 90 and a second NAND gate 92. First NAND gate 90 can have one input that receives the reset signal RST directly and another input that receives the reset signal RST by way of an inverting delay path 94. The inverting delay path 94 can include an odd number of inverters. In FIG. 9, the inverting delay path 94 includes five inverters. The output of the inverting delay path 94 can be the first reset signal RST1. The output of the first NAND gate 90 can be the second reset signal RST2.

The second NAND gate 92 can have one input that receives the second reset signal RST2 directly, and another input that receives the second reset signal RST2 by way of a non-inverting delay path 96. The non-inverting delay path 96 of FIG. 9 includes four inverters. The output of the non-inverting delay path 96 can be the third reset signal RST3. The output of second NAND gate 92 can driven by buffer path 98 to generate the fuse reset signal FRST. Buffer path 98 of FIG. 9 includes three inverters.

Figure 19:
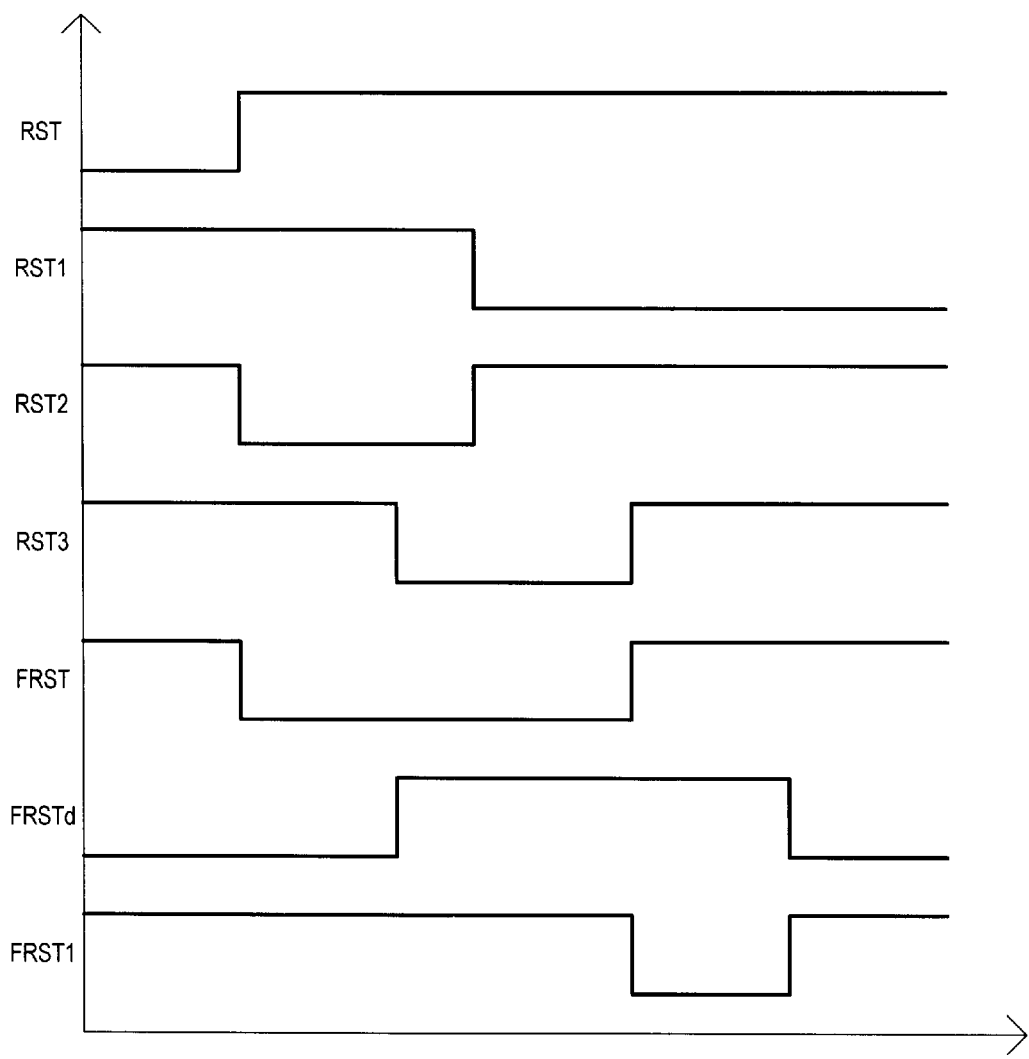
FIG. 19 is a timing diagram illustrating the generation of fuse reset signals according to one embodiment.
Figure 20:
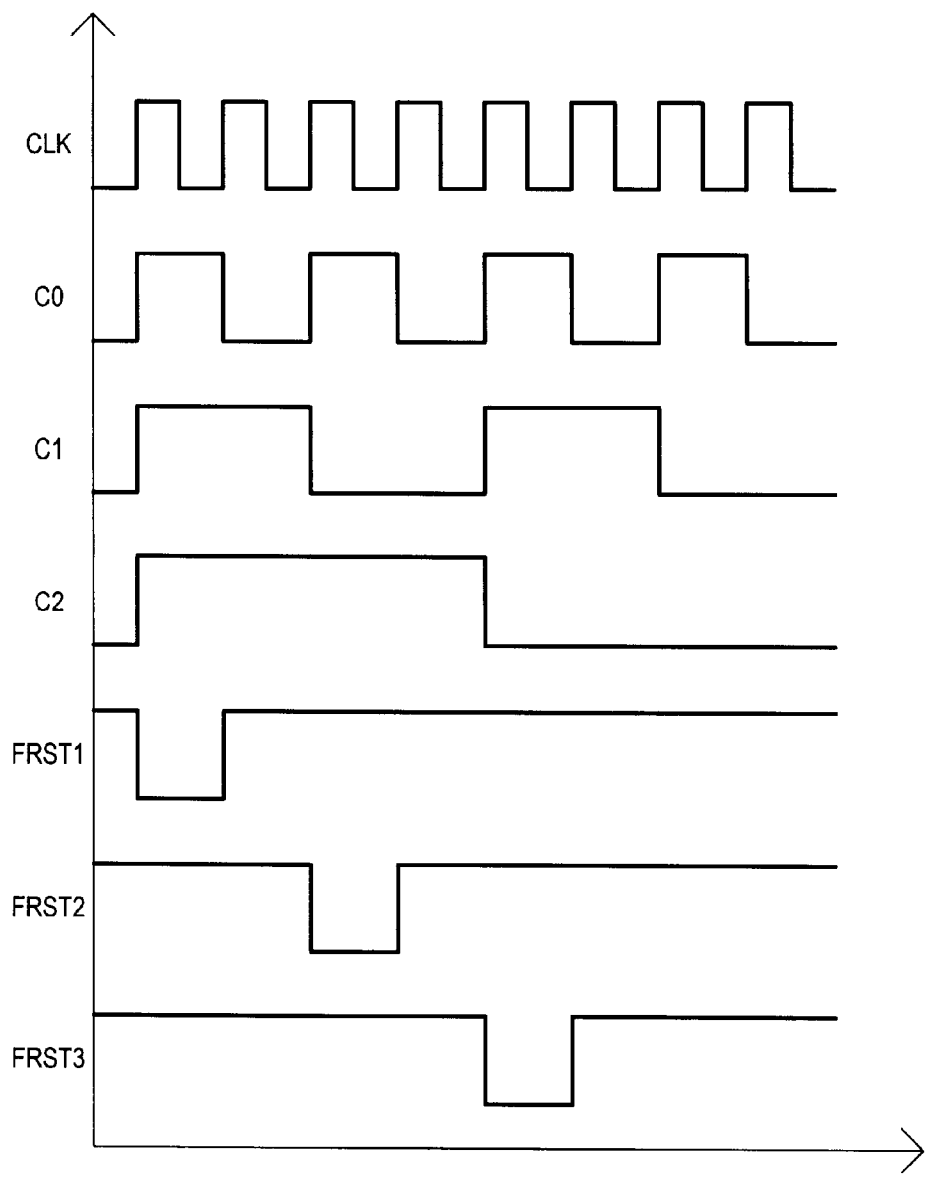
FIG. 20 is a timing diagram illustrating the operation of the redundancy decoder circuit of FIG. 15.

Referring now to FIG. 9 in conjunction with FIG. 19, the operation of the fuse reset signal generating circuit 38 will be described. FIG. 19 is a timing diagram illustrating the response of various signals, including the reset signal RST, the first through third reset signals RST1 to RST3, and the fuse reset signal FRST.

The first reset signal RST1 is essentially the reset signal RST delayed by an amount determined by inverting delay path 94. The second reset signal RST2 can be a low-going pulse having a duration essentially equal to the delay introduced by inverting delay path 94. The third reset signal RST3 can be low-going pulse of the same duration as that of the second reset signal RST2, but delayed with respect to the second reset signal RST2 by an amount determined by non-inverting delay path 96. The resulting fuse reset signal FRST can be low-going pulse having a duration essentially equal to the delay introduced by inverting delay path 94 and non-inverting delay path 96.

It is understood that while the above example has described the reset signal RST as an externally applied signal, a reset signal RST may be generated internally within a semiconductor device.

Figure 10:
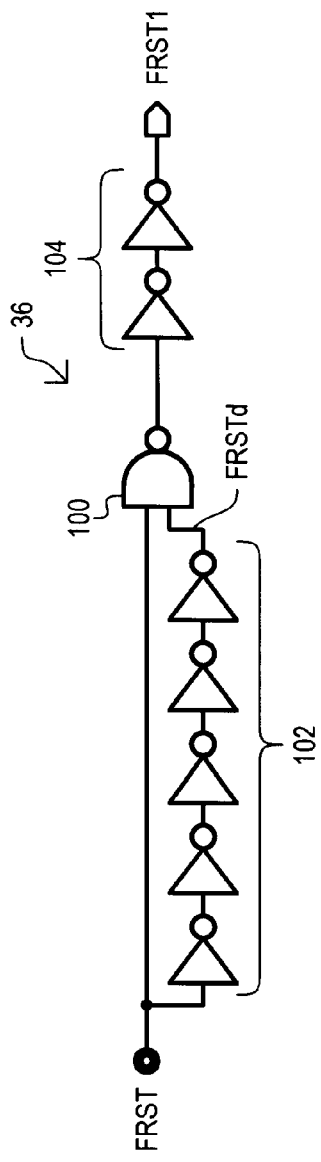
FIG. 10 is a schematic diagram of a delay circuit according to one embodiment.

Having described one particular fuse reset signal generating circuit, particular delay circuits (such as that shown as 36 in FIG. 4) will now be described. Referring now to FIG. 10, a delay circuit is set forth, designated by the general reference character 36. The delay circuit 36 can receive a fuse reset signal FRST and generate a delayed first reset signal FRST1. The delay circuit 36 may include a NAND gate 100 having one input that receives the fuse reset signal FRST directly and another input that receives the fuse reset signal FRST by way of an inverting delay path 102. The inverting delay path 102 can include an odd number of inverters. In FIG. 9, the inverting delay path 102 includes five inverters. The output of the inverting delay path 102 can be an intermediate fuse reset signal FRSTd. The output of NAND gate 100 can be driven by buffer path 104 to generate the delayed fuse reset signal FRST1. Buffer path 104 of FIG. 10 includes two inverters.

Referring now to FIG. 10 in conjunction with FIG. 19, the operation of the delay circuit 36 will be described. In addition to the timing signals previously described, FIG. 19 also shows the response of the intermediate fuse reset signal FRSTd and the delayed fuse reset signal FRST1.

As shown in FIG. 19, the intermediate fuse reset signal FRSTd can be a high-going pulse having the same essential duration as the fuse reset signal FRST, but delayed with respect to the FRST signal by an amount determined by inverting delay path 102. The resulting delayed fuse reset signal FRST1 can be low-going pulse that begins at the termination of the low-going FRST pulse, and has a duration essentially equal to the delay introduced by inverting delay path 102.

Figure 11:
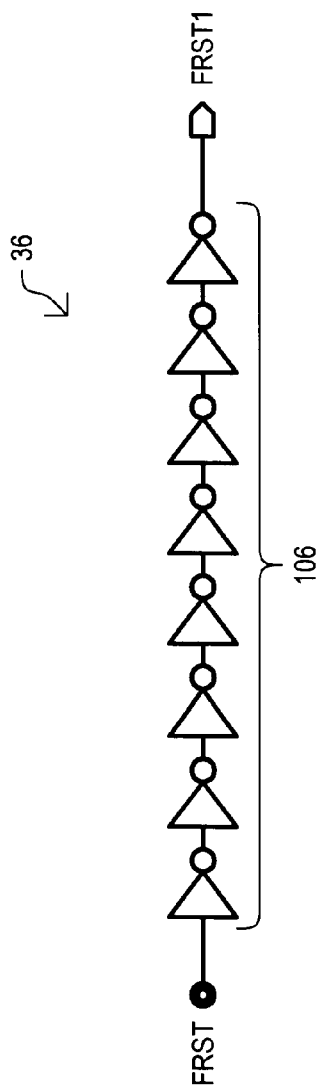
FIG. 11 is a schematic diagram of a delay circuit according to a first embodiment.

A second example of a delay circuit, such as that shown as 36 in FIG. 4, is shown in FIG. 11. The delay circuit of FIG. 11 is designated by the reference character 38 and is shown to receive a fuse reset signal FRST and generate a delayed first reset signal FRST1. The delay circuit 36 may include a non-inverting delay path 106. The non-inverting delay path 106 can include an even number of inverters. In FIG. 11, the non-inverting delay path 106 includes eight inverters.

An arrangement such as that shown in FIG. 11 can generate a delayed fuse reset signal that is delayed with respect to a fuse reset signal FRST by an amount determined by non-inverting delay path 106. The duration of a resulting delayed fuse reset signal FRST1 can be essentially the same as that of a received fuse reset signal FRST.

Having described particular examples of a fuse reset signal generating circuit 38 and delay circuits 36, reference will now be made back to FIG. 4. As noted above, in the embodiment of FIG. 4, one fuse reset signal FRST is applied to one set of programming circuits (40-0 to 40-n) while another fuse reset signal FRST1 is applied to another set of programming circuits (40-n+1 to 40-2n). Further, in particular embodiments, the number of programming circuits in each group (40-0 to 40-n and 40-n+1 to 40-2n) can be the same.

Figure 3:
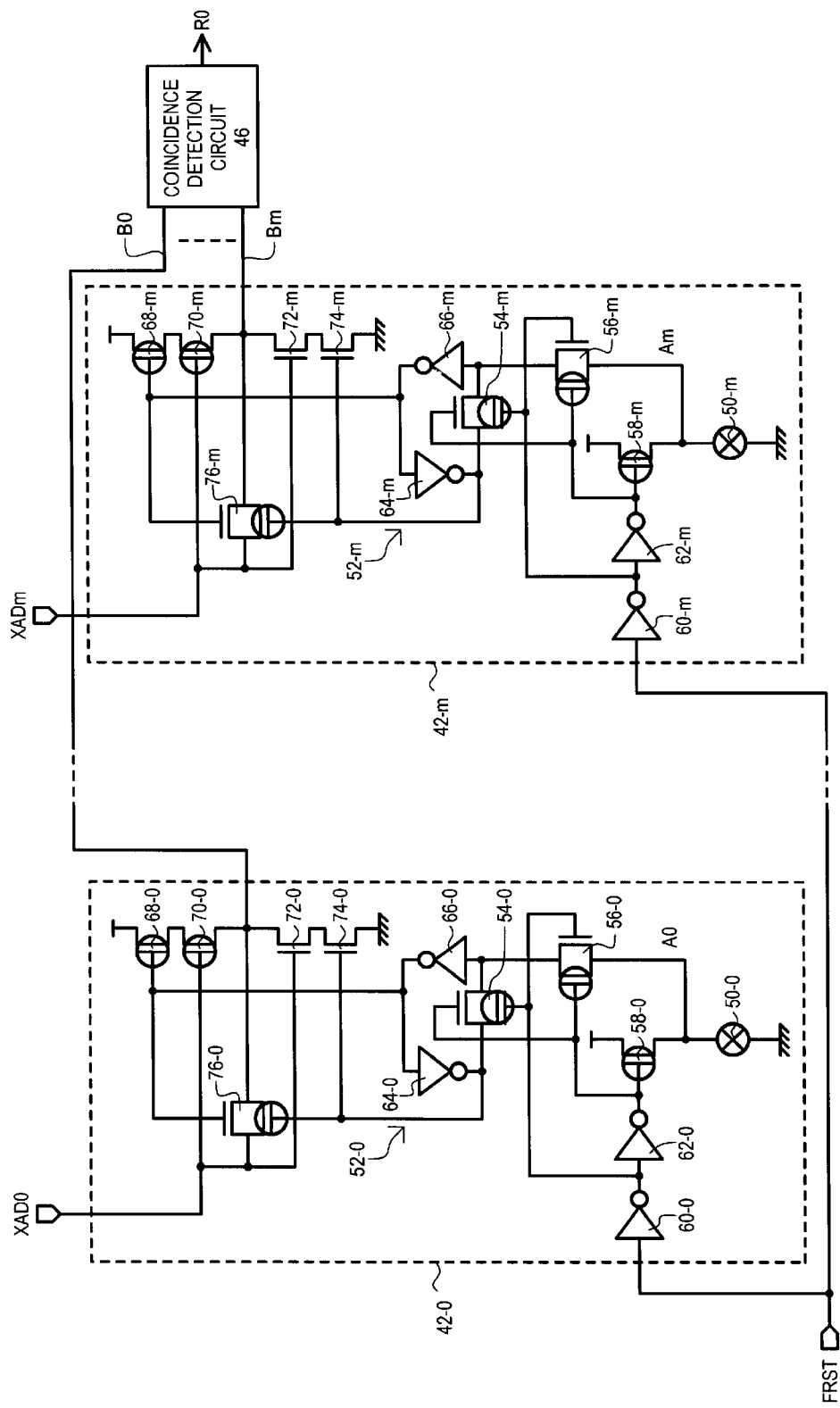
FIG. 3 is a schematic diagram of a programming circuit according to a first embodiment.

Referring now to FIG. 3, a programming circuit is shown that may be used in the various embodiments. The programming circuit of FIG. 3 is shown to include a number of latch circuits 42-0 to 42-m and a coincidence detection circuit 46.

Each latch circuit (42-0 to 42-m) can receive a corresponding address signal (XAD0 to XADm) and the fuse reset signal FRST (or FRST1). Following the activation of the fuse reset signal FRST, each latch circuit (42-0 to 42-m) can generate a corresponding bit compare value B0 to Bm according to the status of a fuse contained within and the value of the incoming address signal (XAD0 to XADm). It is understood that the fuse reset signal of FIG.3 can be a fuse reset signal FRST or a delayed fuse reset signal FRST1.

Referring once again to FIG. 3, a latch circuit (42-0 to 42-m) may include a number of circuit elements. Like elements are shown in FIG. 3 with the same reference character, but followed by a digit (-0 to -m) indicating the particular latch circuit to which it belongs. Each latch circuit (42-0 to 42-m) may be conceptualized as including three parts: a first part that detects that status of a fuse 50, a second part that maintains an indication of the fuse status, and a third part that passes along an address signal (XAD0 to XADm) or an inverted address signal (XAD0 to XADm) depending upon the fuse status information.

A first part of a latch circuit (42-0 to 42-m), for detecting the status of a fuse 50, can include a fuse 50, a p-channel transistor 58, and inverters 60 and 62. A p-channel transistor 58 can be connected between a fuse 50 and a power source. Inverters 60 and 62 can provide control signals based upon the received fuse reset signal FRST. P-channel transistor 58 can be activated according to the output of inverter 62. Each latch circuit (42-0 to 42-m) can include a node A, where the fuse 50 is connected to its corresponding p-channel transistor 58.

In operation, when the fuse reset signal FRST is high, transistor 58 will be turned off. When the fuse reset signal FRST transitions low, transistor 58 can turn on. In the event the fuse 50 is intact it can maintain node A at a low level. In the event the fuse 50 has been opened, p-channel transistor 58 can drive node A to a high level.

When the fuse reset signal FRST subsequently returns high, node A will be pulled low if the fuse 50 is intact or remain high if the fuse 50 has been opened.

It is noted that a fuse 50 may be opened in variety of ways, and the present invention should not be construed as being limited to particular type of fuse. As but two of the many possible examples, a fuse 50 may be opened by running a large amount of current thorough the fuse or by laser irradiation. Further, while a fuse may be particularly advantageous for storing defective address information, as it is well understood and prevalent in many manufacturing processes, fuses represent one particular type of a nonvolatile element. Alternate embodiments may utilize other types of nonvolatile elements.

A second part of a latch circuit (42-0 to 42-m), for maintaining an indication of a fuse status, will now be described. A second part may include a flip-flop 52 formed by inverters 64 and 66, and two transfer gates 54 and 56. Transfer gates 54 and 56 open and close in a mutually exclusive fashion according to the fuse reset signal FRST. More particularly, when the fuse reset signal FRST is low, transfer gate 56 is turned on, while transfer gate 54 is turned off, and vice versa.

In operation, when the fuse reset signal FRST is high, transfer gate 56 isolates node A from the input of inverter 66. When the fuse reset signal FRST transitions low, transfer gate 56 is turned on and the value at node A (which depends upon the state of fuse 50) is input to inverter 66. When the fuse reset signal FRST returns high, transfer gate 56 turns off and transfer gate 54 turns on. With transfer gate 54 turned on, inverters 64 and 66 form the flip-flop 52 that stores the value at node A.

A third part of a latch circuit (42-0 to 42-m), for passing along an address signal or an inverted address signal, will now be described. A third part may include p-channel transistors 68 and 70, n-channel transistors 72 and 74, and a transfer gate 76. The operation of the p-channel and n-channel transistors (68, 70, 72 and 74) can depend upon the value stored in the previously described second part of the latch circuit (i.e., in flip-flop 52).

In the particular arrangement of FIG. 3, if the fuse 50 is intact, the value stored in the second part of the latch circuit (42-0 to 42-m) results in p-channel transistor 68 and n-channel transistor 74 being turned off, while the transfer gate 76 is turned on. Consequently, the corresponding bit compare value B can be essentially the same as the received address value XAD. In contrast, if the fuse 50 is open, the value stored in the second part of the latch circuit (42-0 to 42-m) results in p-channel transistor 68 and n-channel transistor 74 being turned on, while the transfer gate 76 is turned off. Consequently, the corresponding bit compare value B can be the inverse of the received address value XAD.

As shown in FIG. 3, the various bit compare values B0 to Bm can be supplied to the coincidence detection circuit 46. The coincidence detection circuit 46 can provide a redundancy select signal R0. More particularly, in the event the applied address signals XAD0 to XADm match a defective address value (stored by opening selected fuses), all of the resulting bit compare values (B0 to Bm) can have the same value. Such a state can be detected by the coincidence detection circuit 46, which will then activate the redundancy select signal R0.

Figure 16:
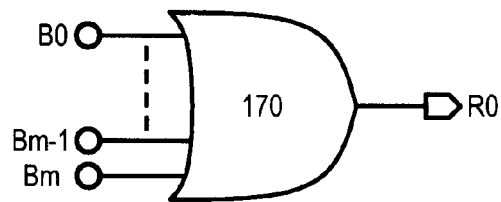
FIG. 16 is a schematic diagram of a coincidence detection circuit according to a first embodiment.

One example of a coincidence detection circuit is shown in a schematic diagram in FIG. 16. The coincidence detection circuit of FIG. 16 is designated by the reference character 170, and can activate a redundancy select signal R0 when all received bit compare values (B0 to Bm) are low. More particularly, the coincidence detection circuit 170 can be an OR gate that drives the redundancy select signal R0 low when all received bit compare values (B0 to Bm) are low.

Figure 17:
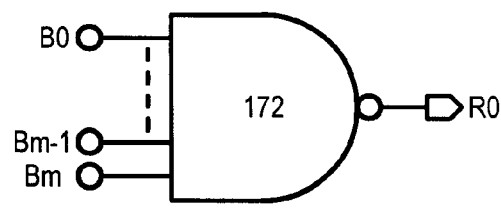
FIG. 17 is a schematic diagram of a coincidence detection circuit according to a second embodiment.

Another example of a coincidence detection circuit is shown in a schematic diagram in FIG. 17. The coincidence detection circuit of FIG. 17 is designated by the reference character 172, and can activate a redundancy select signal R0 when all received bit compare values (B0 to Bm) are high. More particularly, the coincidence detection circuit 172 can be a NAND gate that drives the redundancy select signal R0 low when all received bit compare values (B0 to Bm) are high.

While the coincidence detection circuits of FIGS. 16 and 17 include essentially one stage (i.e., a single gate), alternate embodiments may include multiple stages. More particularly, subsets of all bit compare values can be logically combined to generate intermediate compare values. Such intermediate compare values may be combined by one or more additional stages to generate the redundancy select signal R0. One particular example of a multi-stage coincidence detection circuit is shown in FIG. 18.

Figure 18:
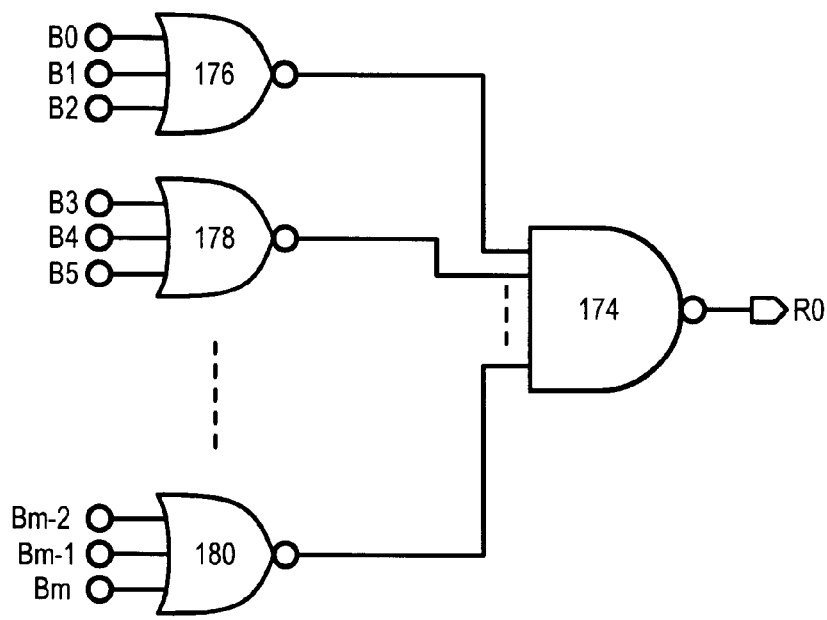
FIG. 18 is a schematic diagram of a coincidence detection circuit according to a third embodiment.

The coincidence detection circuit of FIG. 18 can include first stage gates 176, 178 and 180 and a second stage gate 174. Each first stage gate (176, 178 and 180) can logically combine three bit compare values (B0 to Bm). The outputs of the first stage gates (176, 178 and 180) may then be logically combined in a second stage gate 174. The output of the second stage gate 174 can be the redundancy select signal R0. In the particular example of FIG. 18, first stage gates (176, 178 and 180) can be NOR gates while the second stage gate 174 can be a NAND gate. In such an arrangement, when all of the bit compare values (B0 to Bm) are low, the redundancy select signal R0 can be driven low.

Referring once again to FIG. 1, it is shown that the redundancy decoder 28 can provide redundancy select signals R to redundancy word line driver 30. When a redundancy select signal R is activated, a redundancy word line driver 30 can activate a corresponding redundant word line RW. It is noted that, while not shown in FIG. 1, the operation of the row decoder/word driver 18 can be inhibited when a redundant word line RW is activated, thereby preventing the activation of a "normal" word line W.

In sum, according to one embodiment, a semiconductor memory device 10 may include a redundancy decoder 28 having a number of programming circuits (such as 40-0 to 40-2n). Each programming circuit (40-0 to 40-2n) can include fuses (such as 50-0 to 50-m) for each bit of an internal address (a row address in the examples). The fuses (50-0 to 50-m) can be set to store a defective address.

It is noted that a semiconductor device may include one or more additional "valid" fuses (not shown) for each programming circuit (40-0 to 40-2n). Such valid fuses can indicate if a programming circuit (40-0 to 40-2n) stores a defective address or not.

Having described the arrangement of a semiconductor device according to various embodiments, the operation of the semiconductor device will now be described.

A semiconductor device 10 may first be manufactured. The semiconductor device 10 may then be tested by reading and writing to each memory cell in the memory cell array 12. In the event a defective memory cell is detected, the address of the defective memory cell is determined and then programmed as a defective address within a programming circuit (40-0 to 40-2n). Programming a defective address can include opening selected fuses (50-0 to 50-m). As noted above, opening selected fuses may include running a relatively large amount of current through the fuse or laser irradiation, to name but two examples.

In the particular examples illustrated, programming a defective address can occur in a number of ways. According to a first method, if a defective address has a bit equal to zero, a fuse corresponding to the bit can be opened. If a defective address has a bit equal to one, a fuse corresponding to the bit can be kept intact. According to a second method, if a defective address has a bit equal to zero, a fuse corresponding to the bit can be kept intact. If a defective address has a bit equal to one, a fuse corresponding to the bit can be opened.

A coincidence detection circuit (such as 46 of FIG. 3) can be selected according to a particular fuse programming method. For example, if the first method is used (fuse opened for defective address bit=0), a NAND (or AND) function, such as that shown in FIG. 16 can be used. However, if the second method is used (fuse opened for defective address bit=1), an OR (or NOR) function, such as that shown in FIG. 16 can be used.

Once defective address information is stored by setting fuse states, a fuse state can be stored as a value in a flip-flop each time power is initially supplied to a semiconductor device. Such an operation can be referred to as an "initial setting" operation.

An initial setting can be started by the activation of a reset signal RST. As noted above, such a reset signal RST may, in some embodiments, be applied from the outside of the semiconductor device 10. As shown in FIG. 19, when the reset signal RST transition from a low level to a high level, the fuse reset signal FRST can go low for a prescribed time period. Following a delay, the delayed fuse reset signal FRST1 can also go low for a prescribed time period.

If reference is made back to FIG. 4, the fuse reset signal FRST can be supplied to one set of programming circuits (40-0 to 40-n). This can result in current flowing through the set of programming circuits (40-0 to 40-n). In a similar fashion, the delayed reset signal FRST1 can be supplied to another set of programming circuits (40-n+1 to 40-2n). This can result in current flowing through the other set of programming circuits (40-n+1 to 40-2n).

To better understand an initial setting operation, reference will be made back to FIGS. 3 and 4. A fuse reset signal FRST can be commonly applied to the latch circuits (42-0 to 42-m). When the fuse reset signal FRST is active (low in this case) p-channel transistors 58-0 to 58-m will be turned on. Consequently, the various nodes A0 to Am will be driven high or low depending upon the state of the corresponding fuse (50-0 to 50-m). As noted above, if a fuse (50-0 to 50-m) is opened, its corresponding node (A0 to Am) can be high. If a fuse (50-0 to 50-m) is intact, its corresponding node (A0 to Am) can be low.

The high or low potentials at nodes A0 to Am are supplied to flip-flops (52-0 to 52m). As also noted above, when the FRST (or FRST1) signal returns high, the value at nodes A0 to Am will be latched within their respective flip-flops (52-0 to 52-m). In this way, information on the status of fuses 50-0 to 50-m may be set in flip-flops 52-0 to 52-m, respectively.

It is noted that in the event a fuse is intact, the resistance of the fuse can be relatively low. As but one example of a given process, a fuse (50-0 to 50-m) may present a resistance of about 150 Ω. However, the resistance of the total current path from a node (A0 to Am) to a low power supply (e.g., ground) can be considerably higher. As but one example, in some processes the total current path resistance may be as high as 2 to 3 k Ω. Due this relatively high potential, during an initial setting operation, sufficient time should be allocated to ensure that the potential at such a node (A0 to Am) is stable before being latched in a flip-flop (52-0 to 52-m) or the like.

For the particular resistance value of 2 to 3 K Ω described above, 10 to 15 nanoseconds (ns) may be needed to allow a node (A0 to Am) to settle. Therefore, if a fuse reset signal generating circuit (such as that shown as 36 in FIG. 9) is employed, the delay introduced by delay paths 94 and 96, should be set to 10 to 15 ns.

It is also noted that at the time the fuse reset signal FRST (or delayed fuse reset signal FRST1) is active, for those latch circuits (42-0 to 42-m) that have fuses (50-0 to 50-m) intact, current can continuously flow through the fuse (50-0 to 50-m) and the source-drain path of its corresponding p-channel transistor (58-0 to 58-m). Such current flow can contribute to transient current upon power-up.

Continuing with a description of the operation, the information set within the flip-flops (52-0 to 52-m) can be supplied to p-channel transistor pairs (68-0/70-0 to 68-m/70-m), n-channel transistor pairs (72-0/74-0 to 72-m/74-m), and transfer gates (76-0 to 76-m). As such, the bit compare value (B0 to Bm) provided by each latch circuit (42-0 to 42-m) can depend upon the state of its corresponding fuse (50-0 to 50-m). More particularly, and as noted above, if a fuse (50-0 to 50-m) is intact, the corresponding bit compare value (B0 to Bm) can be essentially the same as a received address signal (XAD0 to XADm). Further, if a fuse (50-0 to 50-m) is opened, the corresponding bit compare value (B0 to Bm) can be the inverse of a received address signal (XAD0 to XADm).

In this way, during the initial setting operation, within latch circuits (such as 42-0 to 42-m) where a fuse circuit (50-0 to 50-m) is intact, current can be drawn while the fuse reset signal FRST is at a low level.

However, other portions of latch circuit (42-0 to 42-m) can also draw current. In particular, current can be drawn within a flip-flop (such as 52-0 to 52-m) in the latch circuits (42-0 to 42-m). More particularly, a logic value stored within flip-flops (52-0 to 52-m) may have an initial value different from that provided by a node (A0–Am). In such an event, inverters (such as 64-0/66-0 to 64-m/66-m) can draw current as they switch from one value to another value.

Referring now to FIGS. 4 and 19, it will be recalled that one set of programming circuits (40-0 to 40-n) can receive the fuse reset signal FRST, while another set of programming circuits (40-n+1 to 40-2n) can receive the delayed fuse reset signal FRST1. As has been discussed, the programming circuits 40-0 to 40-n can draw current in response to the fuse reset signal FRST, while the programming circuits 40-n+1 to 40-2n can draw current in response to the delayed fuse reset signal FRST1.

As shown by FIG. 19, the delayed fuse reset signal FRST1 is delayed with respect to the fuse reset signal FRST. Thus, the initial setting of the one group of programming circuits (40-0 to 40-n) can occur at a different time than the other group of programming circuits (40-n+1 to 40-2n). In the particular arrangement illustrated by FIGS. 4 and 19, the delayed fuse reset signal FRST1 is activated (transitions low) after the fuse reset signal FRST is deactivated (transitions high).

Due to the above arrangement, the transient current generated by the first group of programming circuits (40-0 to 40-n) can occur at a different point in time than the transient current generated by the second group of programming circuits (40-n+1 to 40-2n). Consequently, the present invention can have a smaller peak current than conventional approaches. By distributing the initial setting current over time, the present invention can prevent transient current from becoming unacceptably high as the number of allowable defective addresses is increased. This is in contrast to conventional cases.

In the conventional approach, such as that shown in FIG. 2, a fuse reset signal FRST is applied to all programming circuits (40-0 to 40-2n) simultaneously. This can produce high transient current. Further, such transient current can increase in proportion to the number of allowable defective addresses.

Figure 21:
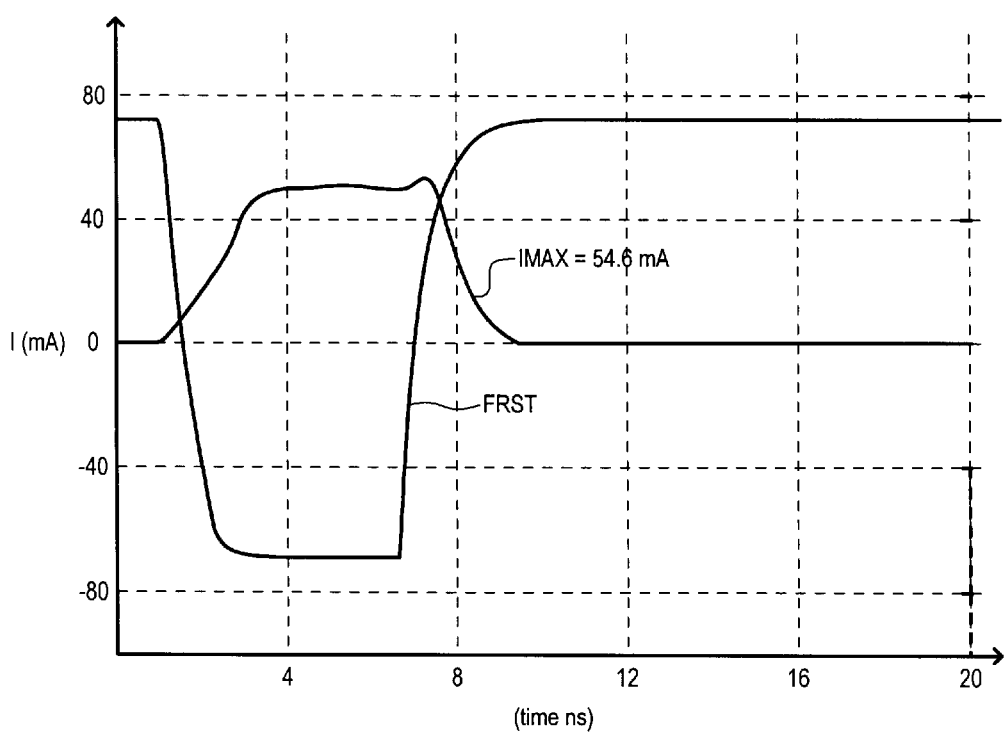
FIG. 21 is a timing diagram illustrating the transient current of an initial setting operation according to a conventional approach.
Figure 22:
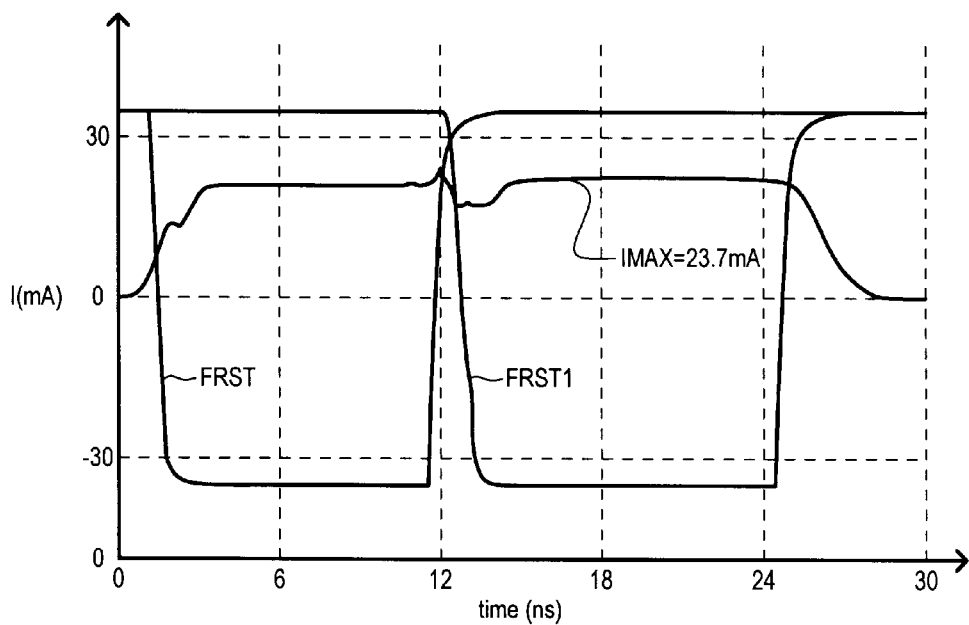
FIG. 22 is a timing diagram illustrating the transient current of an initial setting operation according to one embodiment.

Advantageous effects of the present invention will now be described with reference to FIGS. 21 and 22. FIG. 21 shows a resulting transient current drawn by a conventional redundant decoder 28-0. FIG. 22 shows a resulting transient current drawn by a redundant decoder 28-1 according to one embodiment. In the case of FIG. 21, the peak transient current is 54.6 mA. In contrast, in the case of FIG. 22, the peak transient current is 23.7 mA.

It is noted that in the conventional case, the wiring that distributes a fuse reset signal FRST can introduce some delay. Thus, a fuse reset signal FRST may not be received by all programming circuits (40-0 to 40-2n) simultaneously. Such a difference in signal timing can result in some slight distribution of transient current. However, such variation in signal propagation delay is typically in the order of 1 ns, which is not sufficient to carry out initial setting (which can take 10–15 ns, as noted above). Consequently, any current reduction resulting from propagation delay is not believed to be substantial.

Referring back to FIG. 1, once defective addresses have been set within a redundancy decoder 28, the memory device 10 can receive address values ADD. If a resulting internal address XAD matches a stored defective address within redundancy decoder 28, the redundancy decoder 28 can activate a redundancy detect signal R. Redundancy word driver 30 can activate a redundant word line RW in response to a particular redundancy detect signal R. Though not illustrated in FIG. 1, at this time, the operation of the row decoder/word decoder 18 can be inhibited.

Redundant memory cells within redundant memory cell array 26 that are selected by a redundant word line RW can be connected by a column switch 22 to an input/output circuit 24. The particular memory cell columns connected by column switch 22 can be determined by an internal column address YAD that is decoded by column decoder 20.

It is understood that the particular arrangement of generating a delayed fuse reset signal FRST1 should not be construed as being limited to the particular example of FIG. 4. As but one example, delayed fuse reset signals can be generated according to FIG. 5.

Figure 5:
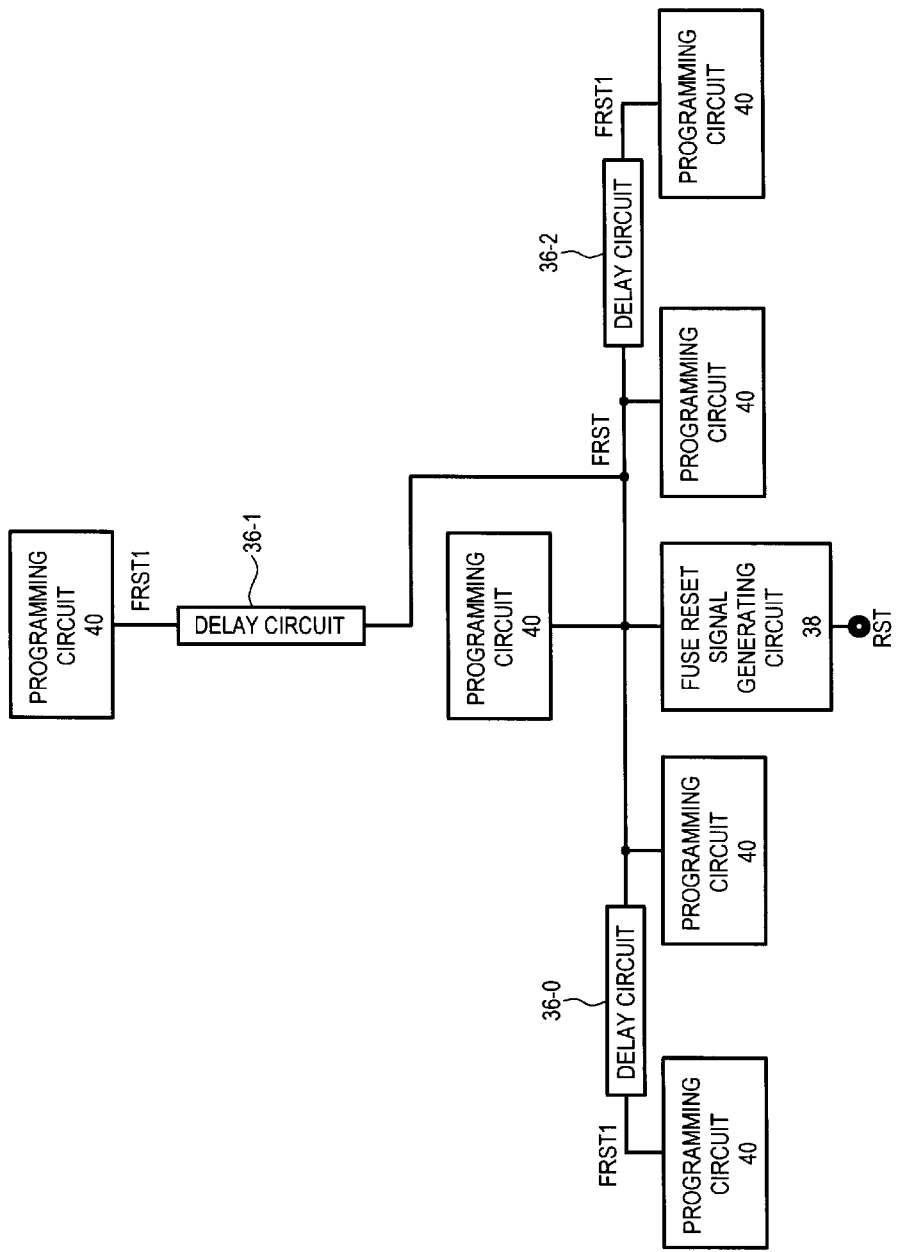
FIG. 5 is a block diagram of a redundancy decoder circuit according to a second embodiment.

FIG. 5 is a redundancy decoder circuit according to another embodiment. An embodiment such as that shown in FIG. 5 may be particular useful in cases where programming circuits 40 have a dispersed layout making it difficult to route reset signal wiring from a single delay circuit. In FIG. 5, a fuse reset signal FRST generated by a fuse reset signal generating circuit 38 can be delayed by various delay circuits (36-0 to 36-2) before being applied to corresponding programming circuits 40.

It is also understood that the particular arrangement of generating a single delayed fuse reset signal should also not be construed as limiting. If it is desirable to further disperse the generation of transient current due to redundancy circuits, a number of delay circuits may be connected in series. One such arrangement is shown in FIG. 6.

Figure 6:
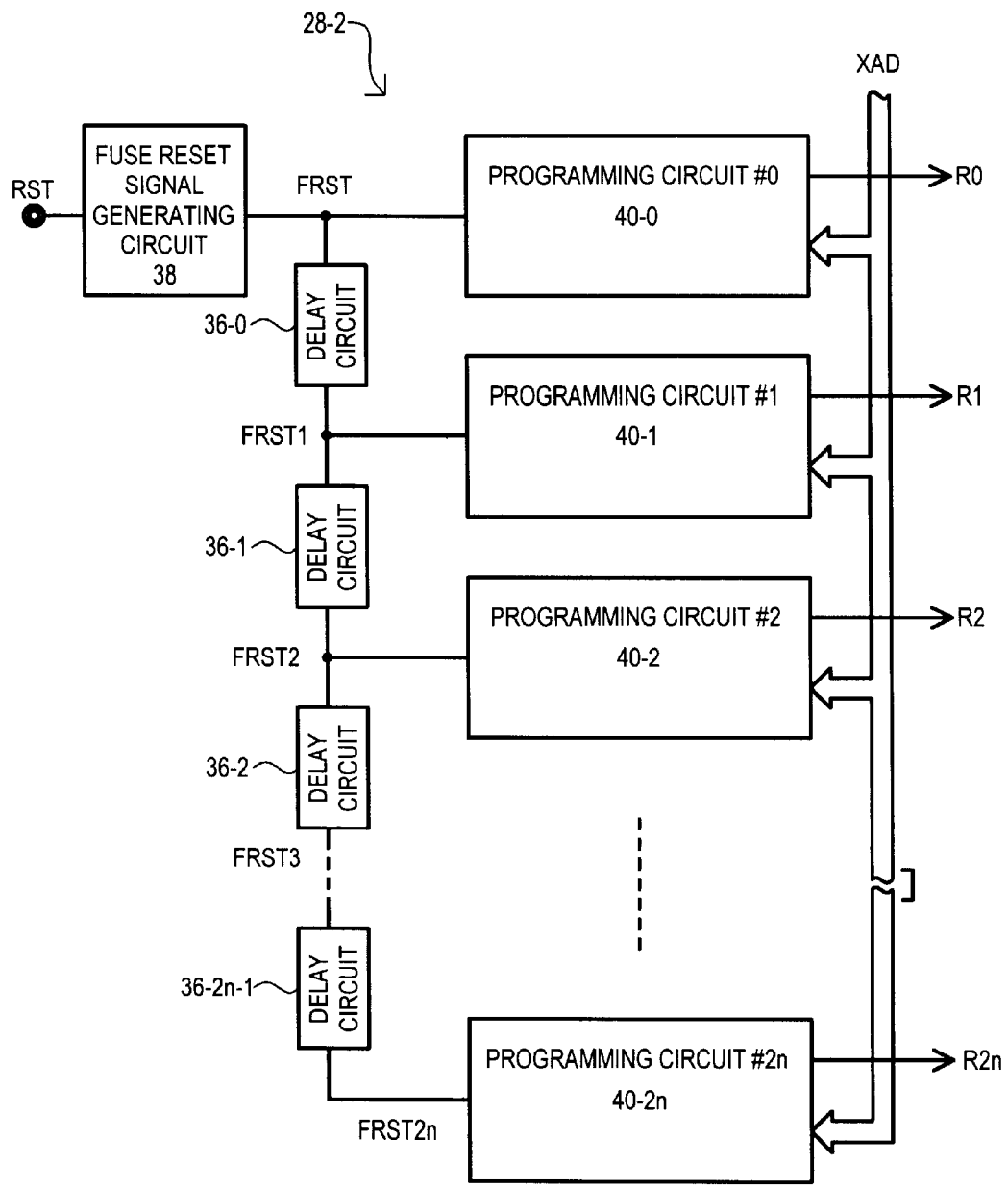
FIG. 6 is a block diagram of a redundancy decoder circuit according to a third embodiment.

The redundancy circuit of FIG. 6 is designated by the general reference character 28-2, and may include a fuse reset signal generating circuit 38 that supplies a fuse reset signal FRST to one programming circuit 40-0. The fuse reset signal FRST is delayed by series connected delay circuits 36-0 to 36-2*n*–1, resulting in a number of delayed fuse reset signals FRST1 to FRST2n. The various delayed fuse reset signals FRST1 to FRST2n can be supplied to corresponding programming circuits (40-1 to 40-2*n*). Of course, while the arrangement of FIG. 6 includes a delay circuit (36-0 to 36-2*n*–1) associated with each of the programming circuits 40-1 to 40-2*n*, alternate embodiments may include multiple delay circuits arranged in series, with one or more delay circuits supplying a delayed fuse reset signal to a group of programming circuits.

It is further notes that while the timing arrangement of FIG. 19 shows a fuse reset signal FRST and delayed fuse reset signal FRST1 that do not overlap one another, alternate embodiments can include overlapping fuse and delayed fuse reset signals. In particular, if reference is made back to FIG. 6, the various fuse reset signals FRST and FRST1 to FRST2n could overlap one another, yet still provide reductions in transient current. An example of such an approach is shown in FIG. 23.

Figure 23:
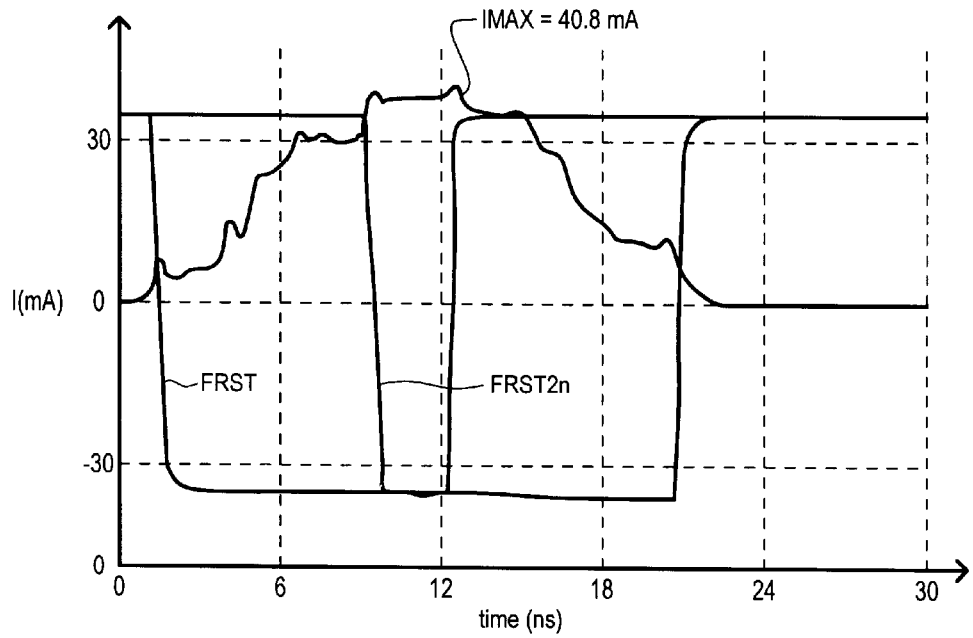
FIG. 23 is a timing diagram illustrating the transient current of an initial setting operation according to another embodiment.

FIG. 23 is a timing diagram showing the resulting transient current when fuse reset signals FRST and FRST1 to FRST2n all overlap one another. FIG. 23 only includes the first fuse reset signal FRST and the last delayed fuse reset signal FRST2n to avoid unduly cluttering the view. Therefore, it is understood that in FIG. 23 delayed fuse reset signals FRST1 to FRST2n–1 are also activated. As shown by FIG. 23, the peak transient current drawn in the example is 40.8 mA.

If reference is made back to FIGS. 21 and 22, it is shown that the peak transient current drawn in the example of FIG. 23 is less than that of the conventional case (FIG. 21), but more than the case where there is no overlap in fuse signals (FIG. 22). While the example of FIG. 23 draws more current than that of FIG. 22, it can accomplish an initial setting operation in a faster amount of time. Thus, the approach of FIGS. 6 and/or 23 may be more effective where faster initial setting operations are desired.

While the previous described embodiments have illustrated shifting the operation of programming circuits with respect to one another, alternate approaches can shift the timing of circuits within a programming circuit. One such approach is shown in FIG. 7.

Figure 7:
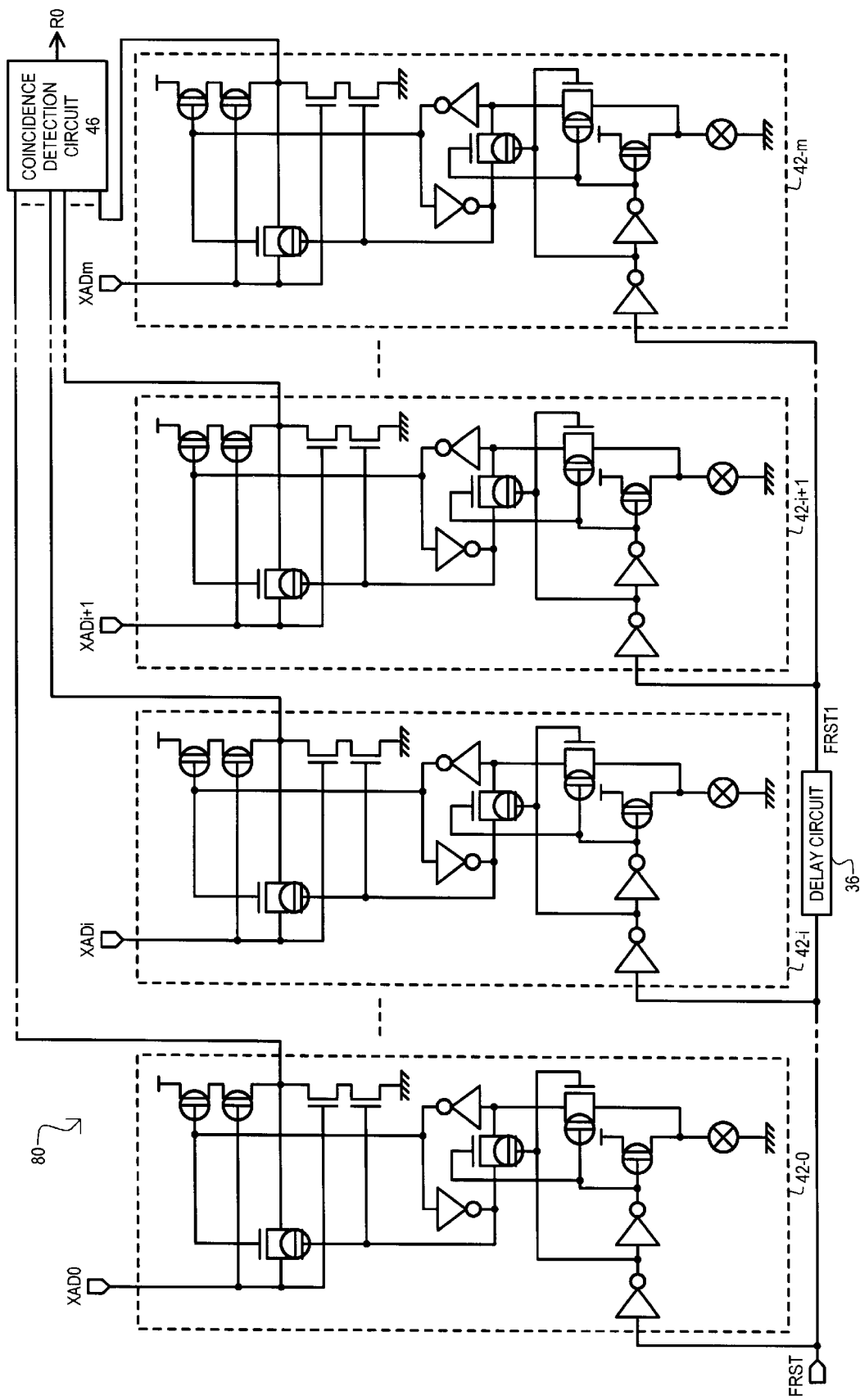
FIG. 7 is a schematic diagram of a programming circuit according to a second embodiment.

FIG. 7 is a schematic diagram of a programming circuit 80 according to one alternate embodiment. In the approach of FIG. 7, latch circuits (42-0 to 42-m) can be arranged into groups. The operation of the latch circuit groups is shifted with respect to one another. In particular, latch circuits 42-0 to 42-i can form one group that is activated in response to a fuse reset signal FRST. Latch circuits 42-i+1 to 42-m can form another group that is activated in response to a delayed fuse reset signal FRST1. Such an arrangement can distribute the activation of multiple latch circuits over time, thereby reducing transient current.

Figure 8:
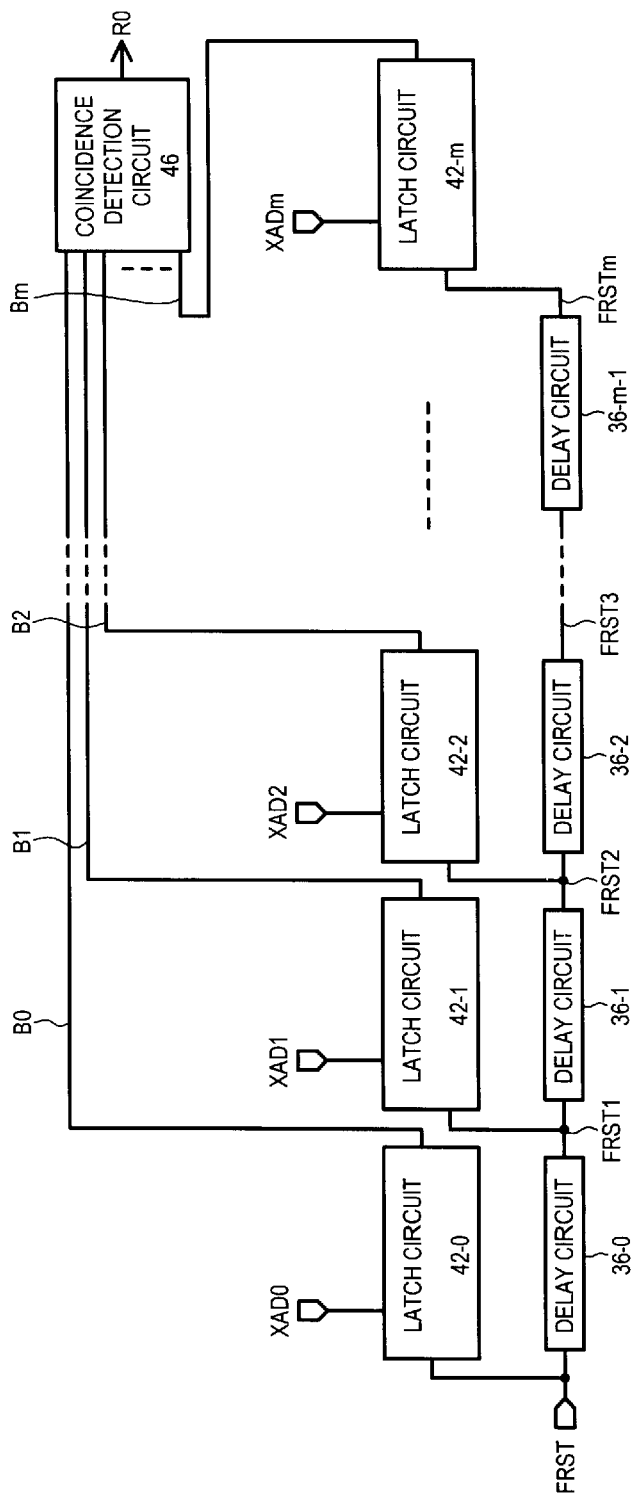
FIG. 8 is a block diagram of a programming circuit according to a third embodiment.

It is noted that a delay circuit 36 may be provided to each latch circuit (42-0 to 42-m), or alternatively, a delay circuit may be provided for multiple programming circuits 80. FIG. 8 shows one example of multiple such delay circuits (36-0 to 36-m–1). More particularly, delay circuits (36-0 to 36-m–1) are arranged in series, the output of each providing a corresponding delayed fuse reset signal (FRST1 to FRSTm) to a latch circuit (42-0 to 42-m).

It is further noted that a delay circuit 36 may generate fuse reset signals (FRST and FRST1) that overlap one another, or that do not overlap one another. Still further, multiple delay circuits 36 can be provided to shift all, or more than two groups of latch circuits (42-0 to 42-m) with respect to one another.

Figure 14:
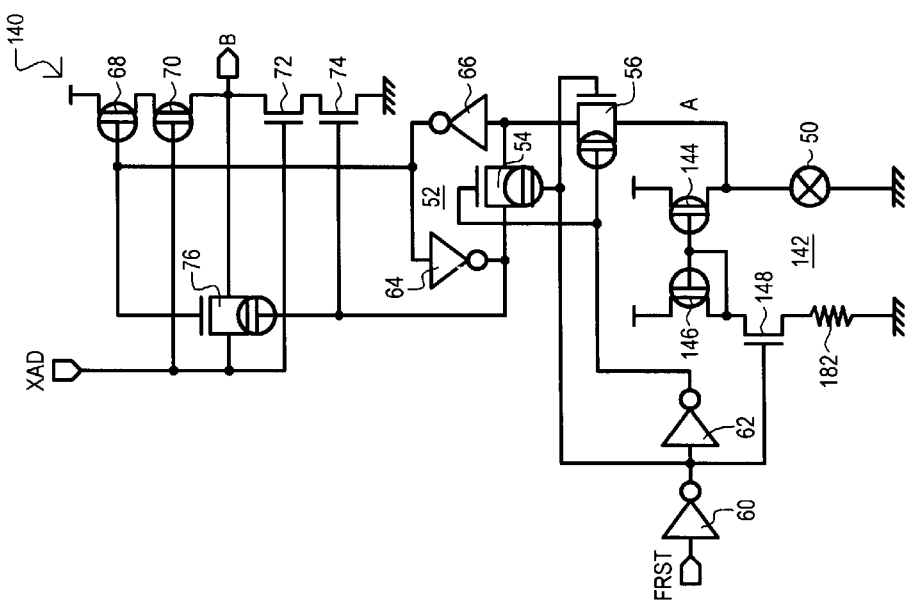
FIG. 14 is a schematic diagram of a latch circuit according to a third alternate embodiment.
Figure 13:
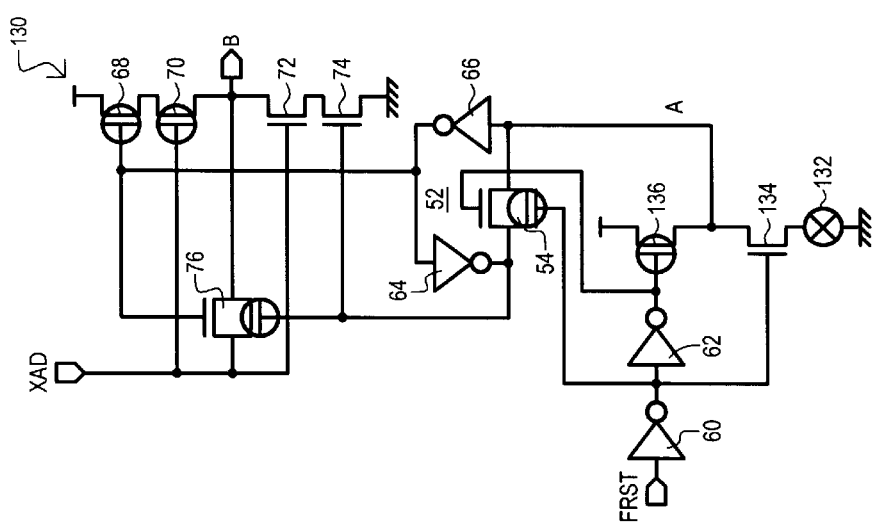
FIG. 13 is a schematic diagram of a latch circuit according to a second alternate embodiment.

It is also understood that the present invention should not be construed as being limited to the particular latch circuit of FIGS. 3 and 7. As but a few examples, a first alternate latch circuit is shown as item 110 in FIG. 12, a second alternate latch circuit is shown as item 130 in FIG. 13, or a third alternate latch circuit is shown as item 140 in FIG. 14.

Figure 12:
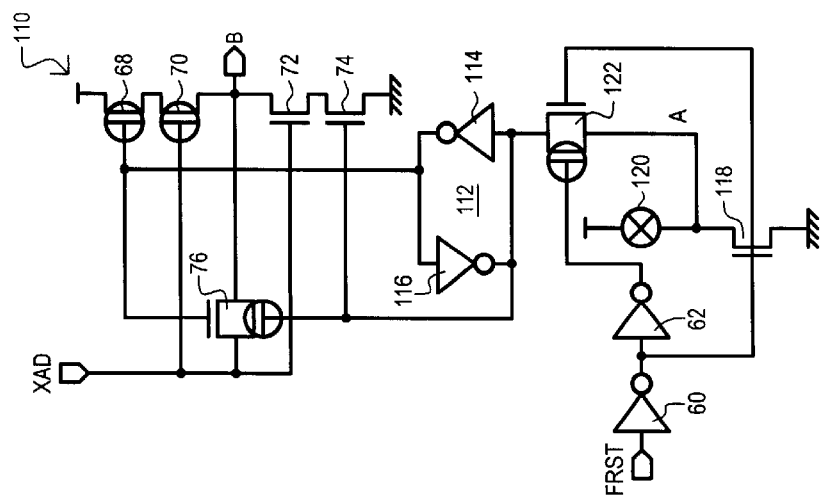
FIG. 12 is a schematic diagram of a latch circuit according to a first alternate embodiment.

The first alternate latch circuit 110 shown in FIG. 12 illustrates one example that provides a different logic value according to whether a fuse 120 is intact or not. In particular, the latch circuit 110 includes an n-channel transistor 118 having a source-drain path in series with fuse 120. N-channel transistor 118 is activated by a fuse reset signal FRST (or delayed fuse reset signal FRST). In the arrangement of FIG. 12, when the fuse reset signal FRST is low, n-channel transistor 118 is turned on. If the fuse 120 is intact, node A will remain high. However, if fuse 120 is opened, node A will be pulled low. In addition, a low fuse reset signal FRST turns on a transfer gate 122 allowing the logic value at node A to be stored in flip-flop 112 composed of cross-coupled inverters 114 and 116.

The second alternate latch circuit 130 can operate in the same general fashion as the example set forth in FIGS. 3 and 7, but a first portion may include a p-channel transistor 136 having a source-drain path between a power node and an output node A, an n-channel transistor 134 having a source-drain path between the output node and a fuse 132, and a fuse 132 between n-channel transistor 134 and a low power supply.

The third alternate latch circuit 140 can include a first part with a current mirror arrangement 142. More particularly, a current mirror 142 can include p-channel transistors 144 and 146 having commonly connected gates. One leg of the circuit includes the series connection of the source drain paths of p-channel transistor 146, n-channel transistor 148, and a resistor 182. The gates of p-channel transistors 146 and 144 may be connected to the drain-drain connection of p-channel transistor 146 and n-channel transistor 148. A second leg may include the source-drain path of p-channel transistor 144 and fuse 50. In response to an active (low in this case) fuse reset signal, n-channel transistor 148 can be turned on, enabling the current mirror circuit.

It is further understood that while the particular delay circuits have been shown in FIGS. 10 and 11, these circuits should also not be construed as limiting to the invention. As but one example, a counter circuit can be used to delay a fuse reset signal FRST and thereby generate a delayed fuse reset signal FRST1. One example of such an approach is shown in FIG. 15.

Figure 15:
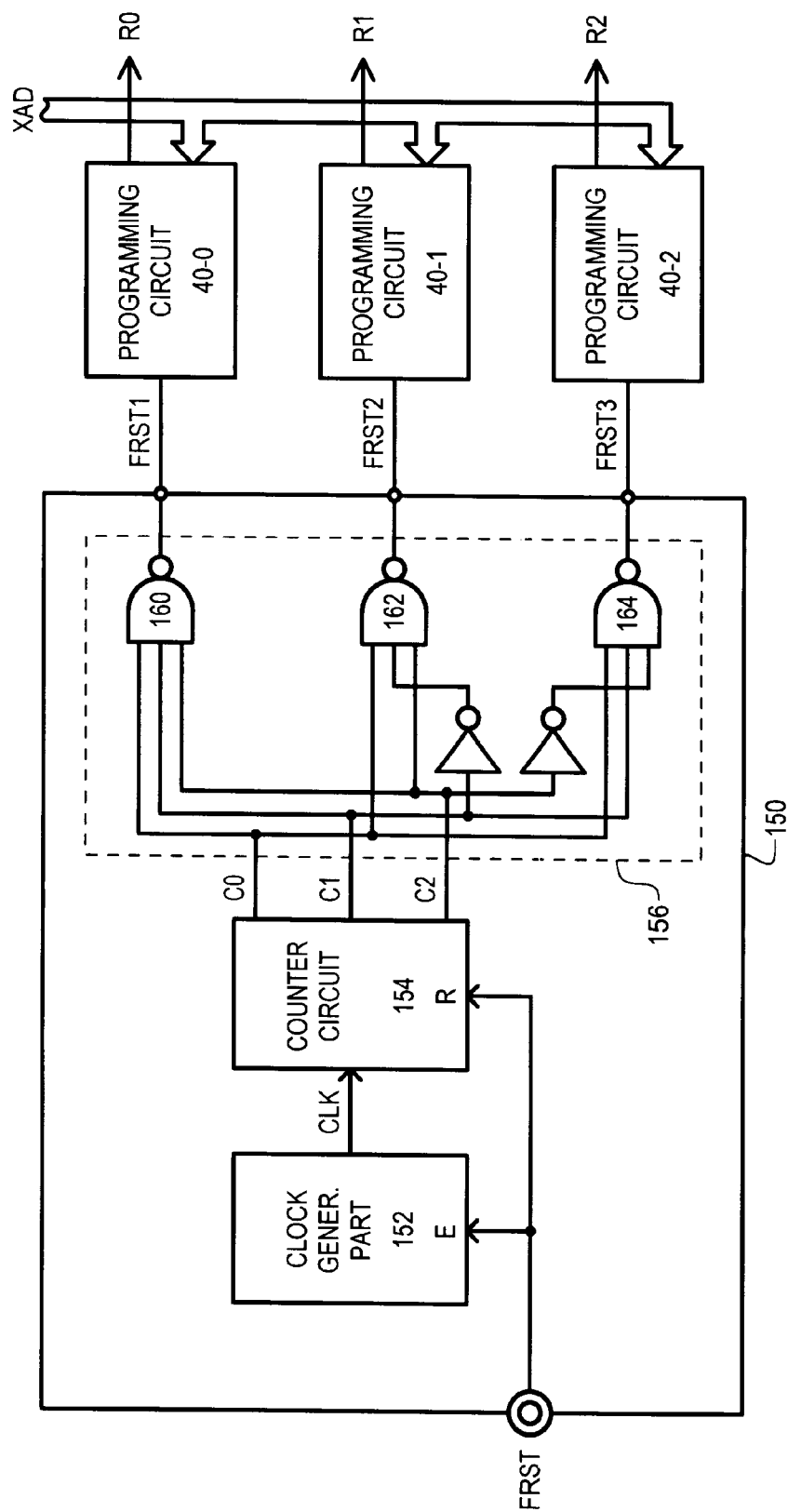
FIG. 15 is a block diagram of a redundancy decoder circuit according to a fourth embodiment.

FIG. 15 is a block diagram of a redundancy decoder according to a fourth embodiment. The arrangement of FIG. 15 is shown to include a fuse reset signal generating circuit 150 that can successively activate delayed fuse reset signals FRST1, FRST2, and FRST3 in response to the activation of a fuse reset signal FRST. The fuse reset signal generating circuit 150 may include a clock generation part 152, a counter circuit 154 and a decoder circuit 156.

The clock generation part 152 can generate a periodic clock signal CLK when the fuse reset signal FRST initially rises to an inactive level (high in this case).

The counter circuit 154 can generate count signals C0, C1 and C2. Each count signal can have a period that is a multiple of a clock signal CLK period. More particularly, count signal C0 can have a period that is twice that of the clock signal CLK, count signal C1 can have a period that is four times that of the clock signal CLK, and count signal C2 can have a period that is eight times that of the clock signal CLK. The counter circuit 154 may be reset when the fuse reset signal FRST returns to a high level.

The decoder circuit 156 can receive the various count signals C0 to C2, and generate delayed fuse reset signals FRST1, FRST2 and FRST3. The particular decoder circuit 156 can generate delayed fuse reset signals (FRST1 to FRST3) having low-going pulse with a duration of one clock signal (CLK) cycle. Further, the time between the ending of one delayed fuse reset signal pulse and the beginning of a subsequent delayed fuse reset signal pulse is also one clock signal (CLK) cycle.

In the particular redundancy decoder circuit of FIG. 15, each delayed fuse reset signal FRST1 to FRST3 is supplied to a corresponding programming circuit 40-0 to 40-2. As a result, the transient current generated by programming circuits (40-0 to 40-2) can be distributed over time, reducing peak transient current in an initial setting operation.

It is understood that while the arrangement of FIG. 15 generates three delayed fuse reset signals FRST1 to FRST3, alternate embodiments could generate more or less than three delayed fuse reset signals.

FIG. 15 thus presents another example of the way in which the present invention can shift the time at which transient current flows through fuses that are not opened, and thereby lower peak transient current. Such an approach can allow for semiconductor memory devices that are capable of storing larger numbers of defective addresses without a proportional increase in the start-up transient current.

Referring once again to FIG. 3, it will be recalled that in addition to current flowing through p-channel transistors 58 and corresponding fuses 50, current may also be drawn by flip-flops 52 in the event the flip-flop 52 stores an initial value that is different from that driving the p-channel transistor 58/fuse 50 combination. If it is assumed that maintaining a fuse 50 intact corresponds to storing a defective address bit of value "1," the more 1's there are in a defective address, the more current will be drawn by the programming circuit storing the defective address.

Due to the above, a "worst" case condition can exist when a fuse 50 is intact, and its correspond flip-flop 52 stores the opposite logic value. More particularly with reference to FIG. 3, the latch circuit 42-0 could power up with the flip-flop 52-0 providing a high output value (i.e., the output of inverter 66-0 is low, while the output of inverter 64-0 is high). If the fuse 50-0 is intact, when the FRST signal transitions low, a worst case current condition can exist. Current will flow through the fuse 50-0/p-channel transistor 58-0 maintaining node A0 low. At the same time, flip-flop 52-0 will draw current as it switches logic states (i.e., the output of inverter 66-0 changes to high, while the output of inverter 64-0 changes to low). Such a possibility can make an unevenness in the current drawn between the case of a stored address bit of 1 and a stored address bit of 0.

According to one embodiment, transistors can be sized to address the worst case current draw operation described above. If reference is made again to FIG. 3, transistors within flip-flops 52 can be sized to be more likely to power up into a state that does not result in such an unevenness in current draw between stored defective address values. As but one particular example, the inverters 64 and 66 can be complementary metal-oxide-semiconductor (CMOS) transistors, with inverter 64 having n-channel transistors that are larger than p-channel transistors and/or inverters 66 having p-channel transistors that are larger than the n-channel transistors.

In an arrangement such as that described above, flip-flops 52 can have a threshold voltage that favors a fuse intact state. Consequently, flip-flops 52 can power-up into a logic state that draws essentially no current in the event a corresponding fuse 50 is intact. Conversely, such a logic state in the flip-flops 52 will draw current if the corresponding fuse 50 has been opened. However, this can result in more of a balance between the amount of current drawn when a defective address bit is a 1 or a 0.

According the various embodiments, the peak current generated by an initial setting operation can be reduced. This can prevent such transient current from rising proportionally with increases in the number possible defective addresses stored by redundancy circuits.

It is noted that while the various embodiments have set forth examples of a semiconductor memory device, the present invention may be employed in other devices that have relatively large number of nonvolatile elements in a redundancy circuits that draw current upon power-up.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A redundancy circuit, comprising:
    a plurality of first nonvolatile elements for storing location information corresponding to defective integrated circuit portions;

first controllable impedance paths between each first nonvolatile element and a supply node that are controlled by a first timing signal;

a plurality of first volatile circuit elements for storing the location information from the first nonvolatile elements, each first volatile circuit includes at least one flip-flop;

a plurality of second nonvolatile elements for storing location information corresponding to defective integrated circuit portions; and second controllable impedance paths between each second nonvolatile element and the supply node that are controlled by a second timing signal; wherein the second timing signal is activated after the first timing signal.

2. The redundancy circuit of claim 1, wherein:

the first and second nonvolatile elements are fusible links.

3. The redundancy circuit of claim 1, wherein:

the first nonvolatile elements store a first defective address for a semiconductor memory device; and the second nonvolatile elements store a second defective address for the semiconductor memory device.

4. The redundancy circuit of claim 1, wherein:

the first nonvolatile elements store a first portion of a defective address of a semiconductor memory device; and the second nonvolatile elements store a second portion of the defective address of the semiconductor memory device.

5. The redundancy circuit of claim 1, wherein:

the first timing signal is active for a first period; and the second timing signal is active for a second period that does not overlap the first period.

6. The redundancy circuit of claim 1, wherein:

the first timing signal is active for a first period; and the second timing signal is active for a second period that overlaps the first period.

7. The redundancy circuit of claim 1, wherein:

the first and second controllable impedance paths include transistors.

8. The redundancy circuit of claim 1, further including:

a plurality of second volatile circuit elements for storing the location information from the second nonvolatile elements.

9. The redundancy circuit of claim 8, wherein:

the second volatile circuit elements include at least one flip-flop circuit.

10. The redundancy circuit of claim 8, further including:

a plurality of first setting circuits that transfer location information from the first nonvolatile elements to the first volatile circuit elements when the first timing signal is active; and a plurality of second setting circuits that transfer location information from the second nonvolatile elements to the second volatile circuit elements when the second timing signal is active.

11. A redundancy address setting circuit, comprising:

a reset signal generating circuit that generates a reset signal;

at least one delay circuit that receives the reset signal and generates a delayed reset signal;

at least one first latch circuit that includes a first nonvolatile storage circuit for providing defective address information in response to the reset signal and a first volatile storage circuit for storing the defective address information from the first nonvolatile storage circuit; and at least one second latch circuit that includes a second nonvolatile storage circuit for providing defective address information in response to the delayed reset signal and a second volatile storage circuit for storing the defective address information from the second nonvolatile storage circuit.

12. The redundancy address setting circuit of claim 11, including:

a plurality of delay circuits arranged in series that generate a plurality of delayed reset signals; and a plurality of second latch circuits, each receiving one of the delayed reset signals.

13. The redundancy address setting circuit of claim 11, wherein:

each first latch circuit further includes a first setting circuit that couples the first nonvolatile storage circuit to the first volatile storage circuit in response to the reset signal; and each second latch circuit further includes a second setting circuit that couples the second nonvolatile storage circuit to the second volatile storage circuit in response to the delayed reset signal.

14. The redundancy address setting circuit of claim 13, wherein:

each first setting circuit comprises a first transfer gate that receives the reset signal and is disposed between the first nonvolatile storage circuit and the first volatile storage circuit; and each second setting circuit comprises a second transfer gate that receives the delayed reset signal and is disposed between the second nonvolatile storage circuit and the second volatile storage circuit.

15. The redundancy address setting circuit of claim 11, wherein;

each first latch circuit receives an address value and includes a first compare signal generating circuit that provides the received address value as an output signal when the first volatile circuit stores a first value and provides the inverse of the received address value when the first volatile circuit stores a second value; and each second latch circuit receives an address value and includes a second compare signal generating circuit that provides the received address value as an output signal when the second volatile circuit stores the first value and provides the inverse of the received address value when the second volatile circuit stores the second value.

16. A semiconductor memory device, comprising:

a memory cell array including a plurality of memory cells accessed by particular address values;

a redundant memory cell array including a plurality of redundant memory cells accessed by the activation of a redundant access signal;

at least one first programming circuit for storing a first defective address in a nonvolatile fashion, the first programming circuit providing the first defective address to a plurality of first flip-flop circuits and drawing current when a first reset signal is activated;

at least one second programming circuit for storing a second defective address in a nonvolatile fashion, the second programming circuit providing the second defective address and drawing current when a second reset signal is activated;

a reset signal generating circuit that generates the first reset signal; and a delay circuit that generates the second reset signal, the second reset signal being delayed with respect to the first reset signal.

17. The semiconductor memory device of claim 16, wherein:

the delay circuit includes a counter circuit that delays the second reset signal with respect to the first reset signal by a predetermined number of periodic clock signal cycles.

18. The semiconductor memory device of claim 16, wherein:

each first programming circuit includes a plurality of first fusible links having intact or opened states, each first fusible link drawing current when a first reset signal is activated and the first fusible link is intact; and each second programming circuit includes a plurality of second fusible links having intact or opened states, each second fusible link drawing current when a second reset signal is activated and the second fusible link is intact.

19. The semiconductor memory device of claim 18, further including:

each first fusible link provides a corresponding first output signal when the first reset signal is activated, the first output signal having approximately a first voltage when the first fusible link is intact and approximately a second voltage when the first fusible link is opened; and each first flip-flop includes an input coupled to each first fusible link, the input of each first flip-flop having a threshold voltage that is closer to the second voltage than the first voltage.

20. The semiconductor memory device of claim 16, wherein:

the at least one first programming circuit receives a plurality of address values and includes a plurality of nonvolatile elements for storing a defective address value, an output transfer gate corresponding to each nonvolatile element that receives an address value as an input, the output transfer gate being enabled when the corresponding nonvolatile element has a first state and disabled when the corresponding nonvolatile element has a second state; and an output inverter corresponding to each nonvolatile element that receives an address value as an input, the output inverter being disabled when the corresponding nonvolatile element has the first state and enabled when the corresponding nonvolatile element has the second state.

* * * * *